(12) United States Patent
Hwang et al.

(10) Patent No.: US 12,096,625 B2
(45) Date of Patent: Sep. 17, 2024

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Yoonjo Hwang, Gimpo-si (KR); Jiyoung Kim, Seoul (KR); Jungtae Sung, Seoul (KR); Junyoung Choi, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 392 days.

(21) Appl. No.: 17/375,933

(22) Filed: Jul. 14, 2021

(65) Prior Publication Data

US 2022/0139944 A1 May 5, 2022

(30) Foreign Application Priority Data

Nov. 4, 2020 (KR) .................. 10-2020-0146230

(51) Int. Cl.

| | |
|---|---|
| *H10B 41/27* | (2023.01) |
| *G11C 5/02* | (2006.01) |
| *H01L 23/522* | (2006.01) |
| *H01L 23/528* | (2006.01) |
| *H10B 43/27* | (2023.01) |

(52) U.S. Cl.
CPC ............. *H10B 41/27* (2023.02); *G11C 5/025* (2013.01); *H01L 23/5226* (2013.01); *H01L 23/528* (2013.01); *H10B 43/27* (2023.02)

(58) Field of Classification Search
CPC ............... H10B 80/00; H01L 25/0657; H01L 2224/0811; H01L 2224/08147; H01L 2224/8001; H01L 2224/8009; H01L 2224/8034; H01L 2224/80345;
(Continued)

(56) References Cited

U.S. PATENT DOCUMENTS 10,354,980 B1    7/2019  Mushiga et al.
10,403,635 B2    9/2019  Fukuzumi et al.
(Continued)

FOREIGN PATENT DOCUMENTS

KR        20130062033 A     6/2013

*Primary Examiner* — Ali Naraghi
*Assistant Examiner* — E. Rhett Cheek
(74) *Attorney, Agent, or Firm* — Myers Bigel, P.A.

(57) ABSTRACT

A semiconductor device includes a first substrate structure including a first substrate, circuit devices, first interconnection lines, bonding metal layers on upper surfaces of the first interconnection lines, and a first bonding insulating layer on the upper surfaces of the first interconnection lines and on lateral surfaces of the bonding metal layers, and a second substrate structure on the first substrate structure, and including a second substrate, gate electrodes, channel structures, second interconnection lines, bonding vias connected to the second interconnection lines and the bonding metal layers and having a lateral surface that is inclined such that widths of the bonding vias increase approaching the first substrate structure, and a second bonding insulating layer in contact with at least lower portions of the bonding vias. The bonding metal layers include dummy bonding metal layers not connected to the bonding vias and that contacts the second bonding insulating layer.

18 Claims, 30 Drawing Sheets

A

(58) Field of Classification Search
CPC . H01L 2224/80355; H01L 2224/08111; H01L 2224/08145; H01L 2224/80894–80896
See application file for complete search history.

(56) References Cited

U.S. PATENT DOCUMENTS

| | | |
|---|---|---|
| 10,510,738 B2 | 12/2019 | Kim et al. |
| 10,522,514 B2 | 12/2019 | Wu et al. |
| 2010/0109065 A1* | 5/2010 | Oh ..................... H01L 27/0688 |
| | | 257/314 |
| 2013/0140697 A1 | 6/2013 | Park et al. |
| 2017/0011996 A1* | 1/2017 | Lee .................. H01L 21/76877 |
| 2017/0062366 A1* | 3/2017 | Enquist .............. H01L 25/0657 |
| 2017/0287864 A1 | 10/2017 | Yu et al. |
| 2019/0221557 A1* | 7/2019 | Kim ........................ H01L 24/80 |
| 2019/0229125 A1* | 7/2019 | Zhou ...................... H10B 41/27 |
| 2019/0279952 A1* | 9/2019 | Tagami ............... H01L 23/5226 |
| 2020/0144242 A1 | 5/2020 | Park |
| 2020/0328186 A1* | 10/2020 | Liu ......................... H01L 24/83 |
| 2020/0350320 A1* | 11/2020 | Cheng .................. H10B 63/30 |

\* cited by examiner

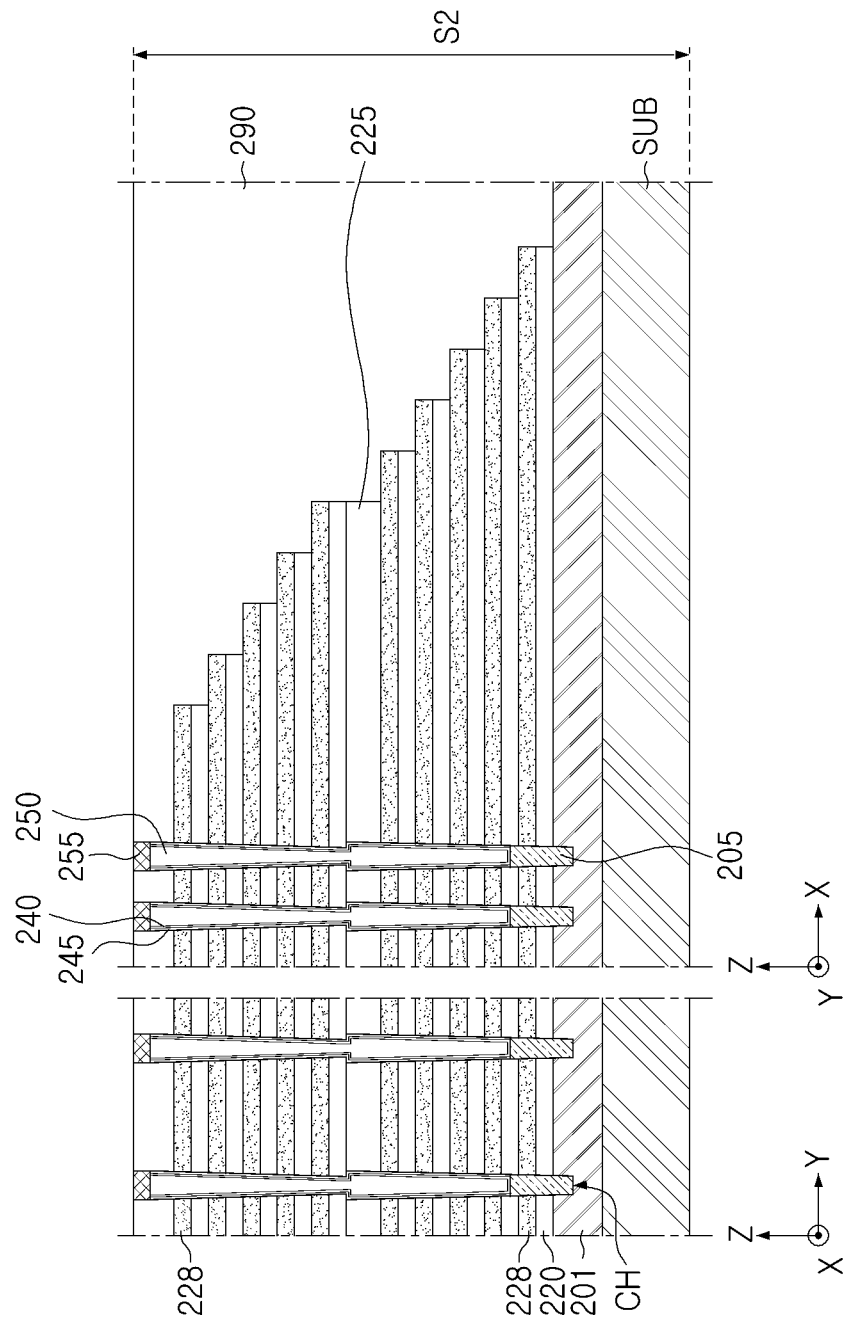

SEMICONDUCTOR DEVICE AND DATA STORAGE SYSTEM INCLUDING THE SAME

CROSS-REFERENCE TO RELATED APPLICATION(S)

This application claims benefit of priority to Korean Patent Application No. 10-2020-0146230 filed on Nov. 4, 2020 in the Korean Intellectual Property Office, the disclosure of which is incorporated herein by reference in its entirety.

BACKGROUND

The present inventive concept relates to a semiconductor device and a data storage system including the same.

In a data storage system that includes data storage, a semiconductor device capable of storing high-capacity data may be needed. Accordingly, methods of increasing data storage capacity of a semiconductor device are being researched. For example, as one method for increasing data storage capacity of a semiconductor device, a semiconductor device including three-dimensionally arranged memory cells, instead of two-dimensionally arranged memory cells, has been proposed.

SUMMARY

Some embodiments of the present inventive concept provide a semiconductor device having an improved degree of integration and mass productivity.

Some embodiments of the present inventive concept provide a data storage system including a semiconductor device having an improved degree of integration and mass productivity.

According to some embodiments of the present inventive concept, a semiconductor device includes a first substrate structure including a first substrate, circuit devices on the first substrate, first interconnection lines on the circuit devices, bonding metal layers on the first interconnection lines, and a first bonding insulating layer on the the first interconnection lines and on lateral surfaces of the bonding metal layers, and a second substrate structure on the first substrate structure and in contact with the first substrate structure, and including a second substrate spaced apart from the first substrate structure, gate electrodes stacked the second substrate and the first substrate structure, spaced apart from each other in a first direction, that is perpendicular to a lower surface of the second substrate, and electrically connected to the circuit devices, channel structures that penetrate the gate electrodes and extend in the first direction and include respective channel layers, second interconnection lines on the channel structures spaced apart from the second substrate, bonding vias between the second interconnection lines and the bonding metal layers, and having a lateral surface that is inclined such that widths of the bonding vias increase approaching the first substrate structure, and a second bonding insulating layer in contact with at least lower portions of the bonding vias. The first substrate structure has a first bonding surface including upper surfaces of the bonding metal layers and an upper surface of the first bonding insulating layer. The second substrate structure has a second bonding surface bonded to the first bonding surface, and including lower surfaces of the bonding vias and a lower surface of the second bonding insulating layer. The bonding metal layers include dummy bonding metal layers not connected to the bonding vias and bonded to the second bonding insulating layer.

According to some embodiments of the present inventive concept, a semiconductor device includes a first substrate structure including a first substrate, circuit devices on the first substrate, bonding structures on the circuit devices and including first interconnection lines, a lower insulating layer on lateral surfaces of the first interconnection lines, and a first bonding insulating layer on the first interconnection lines, and a second substrate structure on the first substrate structure and in contact with the first substrate structure, and including a second substrate spaced apart from the first substrate structure, gate electrodes stacked between the second substrate and the first substrate structure, spaced apart from each other in a first direction, that is perpendicular to a lower surface of the second substrate, and electrically connected to the circuit devices, channel structures that penetrate the gate electrodes and extend in the first direction and include respective channel layers, second interconnection lines on the channel structures spaced apart from the second substrate, bonding vias between the second interconnection lines and the bonding structures, and each being tapered away from the first substrate, and a second bonding insulating layer in contact with at least lower portions of the bonding vias. The first substrate structure has a first bonding surface including upper surfaces of the bonding structures and an upper surface of the first bonding insulating layer. The second substrate structure has a second bonding surface bonded to the first bonding surface, and including lower surfaces of the bonding vias and a lower surface of the second bonding insulating layer. A total area of the upper surfaces of the bonding structures of the first bonding surface is larger than a total area of the lower surface of the bonding vias the second bonding surface.

According to some embodiments of the present inventive concept, a data storage system includes a storage device including a first substrate structure including circuit devices, a second substrate structure including channel structures, and an input/output pad electrically connected to the circuit devices, and a controller electrically connected to the semiconductor storage device through the input/output pad and configured to control the semiconductor storage device. The first substrate structure includes a first substrate, the circuit devices on the first substrate, first interconnection lines on the circuit devices, protruding regions on the first interconnection lines, and a first bonding insulating layer on the first interconnection lines, and the second substrate structure is on the first substrate structure and in contact with the first substrate structure, and includes a second substrate spaced apart from the first substrate, gate electrodes stacked between the second substrate and the first substrate structure, spaced apart from each other in a first direction, that is perpendicular to a lower surface of the second substrate, and electrically connected to the circuit devices, channel structures that penetrate the gate electrodes and extend in the first direction and include respective channel layers, second interconnection lines on the channel structures spaced apart from the second substrate, bonding vias on the second interconnection lines, connected to the second interconnection lines and the protruding regions, and having a lateral surface that is inclined such that widths of the bonding vias increase approaching the first substrate structure, and a second bonding insulating layer in contact with at least lower portions of the bonding vias. The bonding vias have a higher aspect ratio than the protruding regions.

BRIEF DESCRIPTION OF DRAWINGS

The above and other aspects, features, and advantages of the present inventive concept will be more clearly understood from the following detailed description, taken in conjunction with the accompanying drawings, in which:

FIGS. 12A to 12L are cross-sectional views schematically illustrating a method of manufacturing a semiconductor device according to example embodiments.

DETAILED DESCRIPTION

Figure 1:
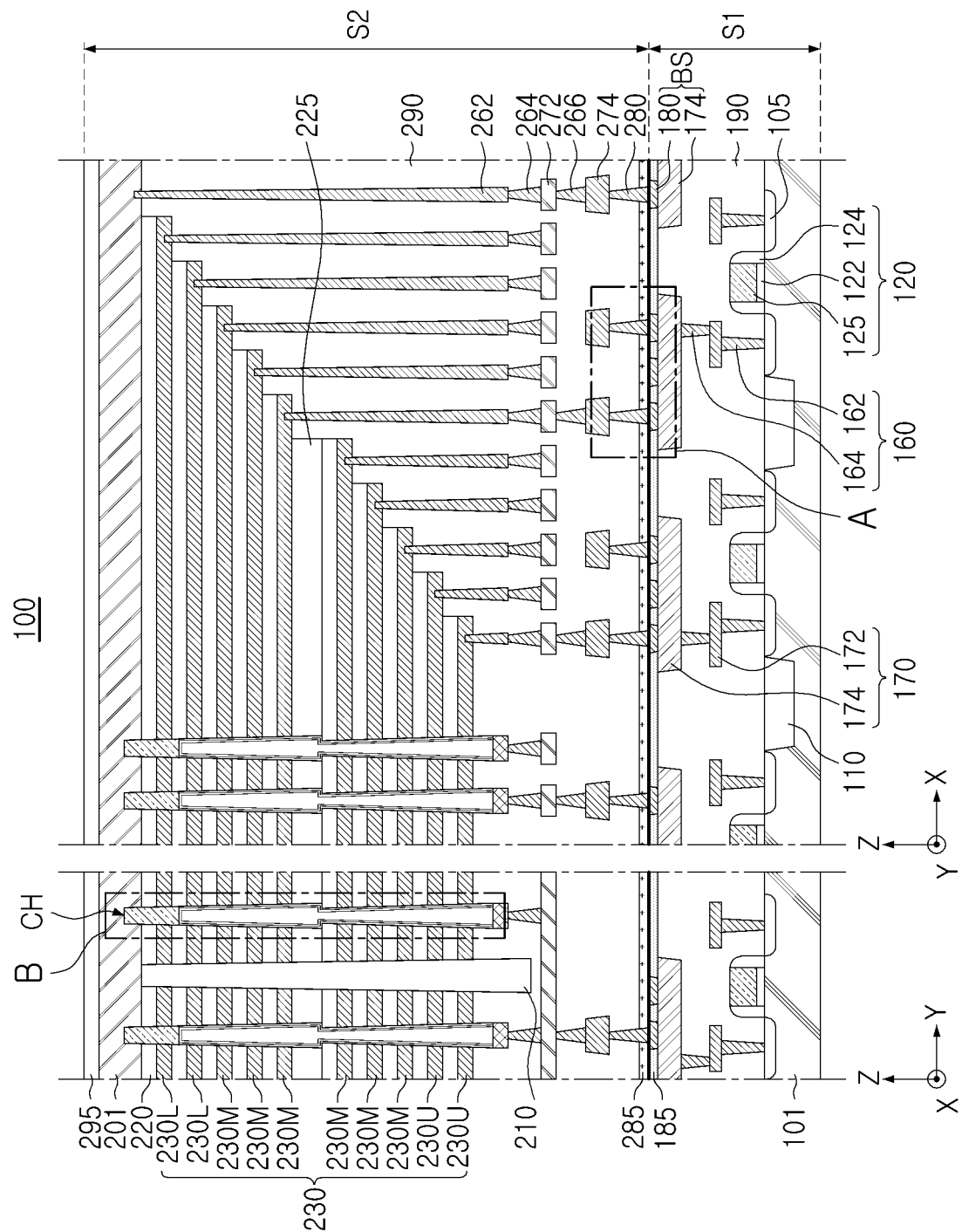
FIG. 1 is a cross-sectional view schematically illustrating a semiconductor device according to example embodiments.

Hereinafter, example embodiments of the present inventive concept will be described with reference to the accompanying drawings. Hereinafter, it can be understood that terms such as 'on (or above),' 'upper portion,' 'upper surface,' 'below,' 'lower portion,' 'lower surface,' and 'lateral surface' may be indicated by reference numerals and may be referred based on drawings, unless otherwise indicated.

Figure 2:
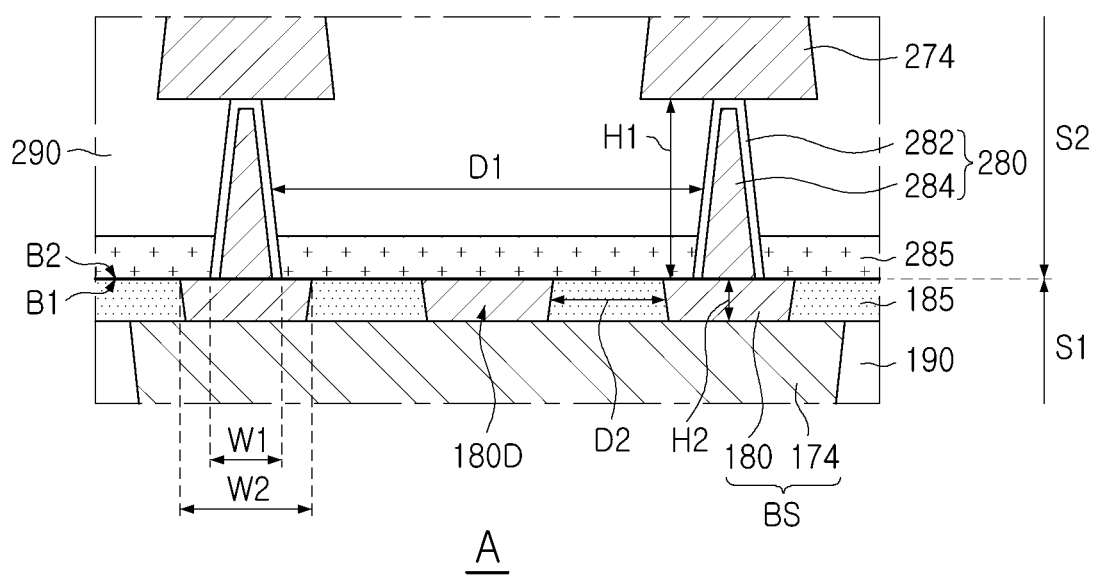
FIG. 2 is a partial enlarged view schematically illustrating a semiconductor device according to example embodiments.

FIG. 1 is a cross-sectional view schematically illustrating a semiconductor device according to example embodiments. FIG. 2 is a partial enlarged view schematically illustrating a semiconductor device according to example embodiments.

Figure 3A:
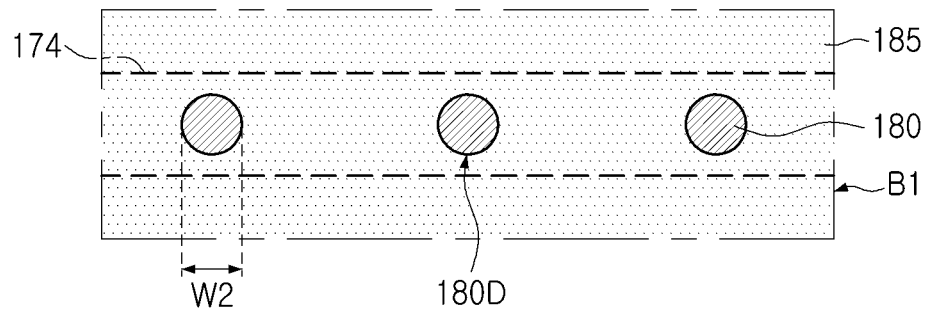
FIGS. 3A and 3B are plan views illustrating bonding surfaces of a semiconductor device according to example embodiments.
Figure 3B:
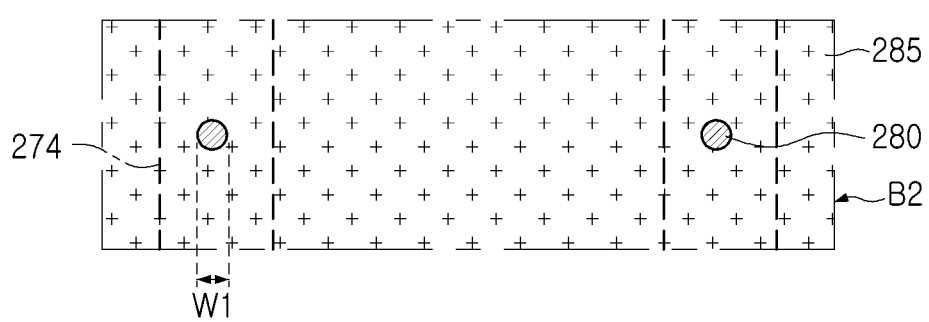

FIG. 2 illustrates to enlarge portion 'A' of FIG. 1. FIGS. 3A and 3B are plan views illustrating bonding surfaces of a semiconductor device according to example embodiments.

Referring to FIGS. 1 to 3B, a semiconductor device 100 may include a first substrate structure S1 and a second substrate structure S2, stacked vertically. For example, the first substrate structure S1 may include a peripheral circuit region of the semiconductor device 100, and the second substrate structure S2 may include a memory cell region of the semiconductor device 100.

The first substrate structure S1 may include a first substrate 101, circuit devices 120 disposed on the first substrate 101, circuit contact plugs 160, circuit interconnection lines 170, bonding metal layers 180, and a first bonding insulating layer 185.

The first substrate 101 may have an upper surface extending in X and Y directions. As used herein, an element extending in a direction may extend longitudinally in that direction. An active region may be defined by device isolation layers 110 in the first substrate 101. Source/drain regions 105 including impurities may be disposed in a portion of the active region. The first substrate 101 may include a semiconductor material, such as a group IV semiconductor, a group III-V compound semiconductor, or a group II-VI compound semiconductor. For example, the first substrate 101 may be provided as a single crystal bulk wafer.

The circuit devices 120 may include planar transistors. Each of the circuit devices 120 may include a circuit gate dielectric layer 122, a spacer layer 124, and a circuit gate electrode 125. The source/drain regions 105 may be disposed in the first substrate 101 on both sides of the circuit gate electrode 125.

A peripheral region insulating layer 190 may be disposed on the circuit device 120 on the first substrate 101. The circuit contact plugs 160 may pass through the peripheral region insulating layer 190 to be connected to the source/drain regions 105, and may include first and second circuit contact plugs 162 and 164, sequentially located from the first substrate 101. An electric signal may be applied to the circuit device 120 by the circuit contact plugs 160. In a region not illustrated, the circuit contact plugs 160 may be connected to the circuit gate electrode 125 as well. The circuit interconnection lines 170 may be connected to the circuit contact plugs 160, and may include first and second circuit interconnection lines 172 and 174, forming a plurality of layers. The first and second circuit interconnection lines 172 and 174 may have a linear shape extending in at least one direction, as illustrated in FIG. 3A. In example embodiments, the number of layers of the circuit contact plugs 160 and the circuit interconnection lines 170 may be variously changed.

The bonding metal layers 180 may be disposed on portions of upper surfaces of the second circuit interconnection lines 174, and upper surfaces of the bonding metal layers 180 may be exposed from a first bonding surface B1, which may be an upper surface of the first substrate structure S1, through the peripheral region insulating layer 190. The bonding metal layers 180 may also be referred to as a protruding region, and, together with the second circuit interconnection lines 174, may be referred to as a bonding structure BS. The bonding metal layers 180 may function as a bonding structure or a bonding layer for joining the first substrate structure S1 and the second substrate structure S2, together with bonding vias 280 of the second substrate structure S2. The bonding metal layers 180 may provide an electrical connection path with the second substrate structure S2. The bonding metal layers 180 may be disposed in a region including a region corresponding to the bonding vias 280.

The bonding metal layers 180 may include dummy bonding metal layers 180D, which may not be connected to the bonding via 280 of the second substrate structure S2, as illustrated in FIG. 2. The dummy bonding metal layers 180D may be bonded to a second bonding insulating layer 285 of the second substrate structure S2, and an upper surface of the dummy bonding metal layers 180D may be entirely covered with or overlap by the second bonding insulating layer 285. In some embodiments, the bonding metal layers 180 may include the dummy bonding metal layers 180D, and metal-dielectric bonding thereby may be used, to secure a misalign-margin and improve a degree of freedom of interconnection. The bonding metal layers 180 may include a conductive material, for example, copper (Cu).

The first bonding insulating layer 185 may be disposed on portions of upper surfaces of the second circuit interconnection lines 174 on which the bonding metal layers 180 are not disposed, such that an upper surface of the first bonding insulating layer 185 is exposed from the first bonding surface B1, which may be the upper surface of the first substrate structure S1. The first bonding insulating layer 185 may be disposed to cover lateral surfaces of the bonding metal layers 180 and surround the bonding metal layers 180. The first bonding insulating layer 185 may be a layer for dielectric-dielectric bonding with the second bonding insulating layer 285 of the second substrate structure S2. As illustrated in FIG. 3A, the first bonding insulating layer 185, together with the bonding metal layers 180, may form the first bonding surface B1 for joining the first substrate structure S1 and the second substrate structure S2. The first bonding insulating layer 185 may also function as a diffusion barrier layer of the bonding metal layers 180, and may include, for example, at least one of SiO, SiN, SiCN, SiOC, SiON, and SiOCN.

The second substrate structure S2 may include a second substrate 201, gate electrodes 230 stacked on a lower surface of the second substrate 201, interlayer insulating layers 220 alternately stacked with the gate electrodes 230, channel structures CH disposed to pass through the gate electrodes 230, separation region 210 passing through the gate electrodes 230 and extending in one direction, a cell region insulating layer 290 covering or overlapping the gate electrodes 230, a passivation layer 295 disposed on the second substrate 201, and a second bonding insulating layer 285 disposed on a lower surface of the cell region insulating layer 290. The second substrate structure S2 may further include first, second, and third cell contact plugs 262, 264, and 266, first and second cell interconnection lines 272 and 274, and bonding vias 280, as an interconnection structure, arranged below the gate electrodes 230 and the channel structures CH.

The second substrate 201 may have a first region in which the gate electrodes 230 are vertically stacked and memory cells are disposed, and a second region, which may be a region in which the gate electrodes 230 extend to have different lengths, and may be a region for electrically connecting to the first substrate structure S1. The first region may include a left area of FIG. 1, and the second region may include a right area of FIG. 1.

The second substrate 201 may have a lower surface extending in the X and Y directions. The second substrate 201 may include a semiconductor material, such as a group IV semiconductor, a group III-V compound semiconductor, or a group II-VI semiconductor. For example, the group IV semiconductor may include silicon, germanium, and/or silicon-germanium. For example, the second substrate 201 may be provided as a polycrystalline layer or an epitaxial layer. According to some embodiments, the second substrate 201 may include a doped region including impurities. In example embodiments, the second substrate 201 may have a thickness that is thinner than a thickness of the first substrate 101, but is not limited thereto.

The gate electrodes 230 may be spaced apart vertically and stacked on the lower surface of the second substrate 201, to form a stack structure, together with the interlayer insulating layers 220. The stack structure may include lower and upper stack structures, vertically stacked, and a connection insulating layer 225, in addition to the interlayer insulating layer 220, may be further disposed between the lower stack structure and the upper stack structure. According to some embodiments, the stack structure may be formed as a single stack structure.

The gate electrodes 230 may include a lower gate electrode 230L forming a gate of a ground select transistor, memory gate electrodes 230M forming a plurality of memory cells, and upper gate electrodes 230U forming gates of string select transistors. In this case, the lower gate electrode 230L and the upper gate electrodes 230U may be referred to as "lower" and "upper," based on directions during a manufacturing process. The number of memory gate electrodes 230M that are part of the memory cells may be determined according to capacity of the semiconductor device 100. In various example embodiments, the upper and lower gate electrodes 230U and 230L may be 1 to 4 or more, respectively, and may have the same or a different structure as the memory gate electrodes 230M. In example embodiments, the gate electrodes 230 may further include a gate electrode 230 disposed below the upper gate electrodes 230U and/or above the lower gate electrode 230L, and may be part of an erase transistor used in an erase operation using a gate-induced-drain-leakage (GIDL) phenomenon. Also, portions of the gate electrodes 230 such as, for example, portions of the memory gate electrodes 230M adjacent to the upper or lower gate electrodes 230U and 230L, may be dummy gate electrodes. Dummy gate electrodes may be place holders in the structure but may not be electrically connected or may not electrically operate in the manner of other electrodes.

The gate electrodes 230 may be stacked on the lower surface of the second substrate 201 to be spaced apart vertically from each other, and may extend to have different lengths in at least one direction, to form a stepped structure. The gate electrodes 230 may be disposed to have a step difference in the X direction, as illustrated in FIG. 1, and/or a step difference in the Y direction. The lengths of the stepped gate electrodes 230 may decrease for the gate electrodes 230 that closer to the first substrate structure S1. Due to the step differences, in the gate electrodes 230, a predetermined region including end portions of the gate electrodes 230 may be exposed. The gate electrodes 230 may be connected to the first cell contact plugs 262 in the region.

The gate electrodes 230 may be disposed to be separated in a certain unit by the separation region 210 in the Y direction. The gate electrodes 230 may form a single memory block between a pair of adjacent separation regions 210, but a range of the memory block is not limited thereto. Portions of the gate electrodes 230 such as, for example, portions of the memory gate electrodes 230M, may form a single layer in the single memory block.

The interlayer insulating layers 220 may be disposed between the gate electrodes 230. Like the gate electrodes 230, the interlayer insulating layers 220 may be spaced apart from each other in a direction, perpendicular to the lower surface of the second substrate 201, and may be disposed to extend in the X direction. The interlayer insulating layers 220 may include an insulating material such as silicon oxide or silicon nitride.

The channel structures CH may be disposed on the lower surface of the second substrate 201 in the first region of the second substrate 201, to be spaced apart from each other while forming rows and columns. The channel structures CH may be disposed to form a grid pattern, or may be disposed in a zigzag shape in one direction. The channel structures CH may have a pillar shape, and have inclined lateral surfaces that become narrower as they approach the second substrate 201, according to an aspect ratio.

Each of the channel structures CH may have a form in which lower and upper channel structures respectively passing through the lower and upper stack structures of the gate electrodes 230 are connected to each other, and may have a bent portion, due to a difference or change in width, in a connection region therebetween. In example embodiments, portions of the channel structures CH may be dummy channels, and the dummy channels may be further disposed outside the channel structures CH. A detailed structure of the channel structures CH will be described in more detail with reference to FIGS. 4A and 4B below.

The separation region 210 may be disposed to pass through the gate electrodes 230 and extend along the X direction. The separation region 210 may be provided as a plurality of separation regions 210, and the plurality of separation regions 210 may be disposed parallel to each other on a plan view. The separation region 210 may pass entirely through the gate electrodes 230, may be stacked on the lower surface of the second substrate 201, and electrically and/or physically connected to or in contact with the second substrate 201. The separation region 210 may extend in the lower and upper stack structures of the gate electrodes 230 without a bent portion, but embodiments are not limited thereto. For example, the separation region 210 may also have a form in which lower and upper separation regions are connected to each other, similarly to the channel structures CH.

The separation region 210 may have a shape in which a width thereof decreases toward the second substrate 201, due to a high aspect ratio. The separation region 210 may include, for example, silicon oxide, silicon nitride, or silicon oxynitride. In example embodiments, a conductive layer may be further disposed in the separation region 210. In this case, the conductive layer may function as a common source line of the semiconductor device 100, or a contact plug connected to the common source line.

The cell region insulating layer 290 may be disposed to cover, surround, or overlap the second substrate 201 and the gate electrodes 230 on the lower surface of the second substrate 201. The cell region insulating layer 290 may be formed of an insulating material, and may be formed as a plurality of insulating layers.

The passivation layer 295 may be disposed on an upper surface of the second substrate 201. The passivation layer 295 may function as a layer protecting the semiconductor device 100. In example embodiments, the passivation layer 295 may have an opening from which a portion is removed, to define a pad region connected to an external device. The passivation layer 295 may include at least one of silicon oxide, silicon nitride, and silicon carbide.

The interconnection structure may include the first, second, and third cell contact plugs 262, 264, and 266, the first and second cell interconnection lines 272 and 274, and the bonding vias 280, and the second substrate structure S2 may be configured to be electrically connected to the first substrate structure S1.

The first cell contact plugs 262 may pass through the cell region insulating layer 290, and may be connected to the gate electrodes 230 and/or to the second substrate 201. The first cell contact plugs 262 may be connected to the second cell contact plugs 264 on a lower end thereof. The second cell contact plugs 264 may be connected to the first cell interconnection lines 272 on a lower end thereof. The third cell contact plugs 266 may connect the first and second cell interconnection lines 272 and 274 in a vertical direction. The first to third cell contact plugs 262, 264, and 266 may have a cylindrical shape. The first to third cell contact plugs 262, 264, and 266 may have different lengths. For example, the first cell contact plugs 262 may have a relatively long length compared to the second and third cell contact plugs 264 and 266. In some embodiments, the first, second, and third cell contact plugs 262, 264, and 266 may have lateral surfaces in which widths of the first, second, and third cell contact plugs 262, 264, and 266 decrease toward the second substrate 201 and increase toward the first substrate structure S1, according to an aspect ratio. According to some embodiments, portions of the first, second, and third cell contact plugs 262, 264, and 266 may be dummy contact plugs to which no electrical signal is applied.

The first cell interconnection lines 272 may include bit lines of the first region connected to the channel structures CH, and interconnection lines of the second region disposed on the same height level as the bit lines. The second cell interconnection lines 274 may be interconnection lines disposed below the first cell interconnection lines 272. The first and second cell interconnection lines 272 and 274 may have a linear shape extending in at least one direction, as illustrated in FIG. 3B. In example embodiments, the second cell interconnection lines 274 may have a thicker thickness than the first cell interconnection lines 272. The first and second cell interconnection lines 272 and 274 may have inclined lateral surfaces to decrease width thereof toward the second substrate 201.

The first, second, and third cell contact plugs 262, 264, and 266 and the first and second cell interconnection lines 272 and 274 may include, for example, tungsten (W), aluminum (Al), copper (Cu), tungsten nitride (WN), tantalum nitride (TaN), titanium nitride (TiN), or combinations thereof.

The bonding vias 280 may be disposed below the second cell interconnection lines 274 and may be connected to the second cell interconnection lines 274, and a lower surface thereof may be exposed from the second bonding surface B2, which may be a lower surface of the second substrate structure S2, through the cell region insulating layer 290. The bonding vias 280 may be joined and connected to the bonding metal layers 180 of the first substrate structure S1, and may function as a bonding structure or a bonding layer for joining the first substrate structure S1 and the second substrate structure S2. The bonding vias 280 may provide an electrical connection path according to the bonding of the first substrate structure S1 and the second substrate structure S2.

As illustrated in FIGS. 2 to 3B, the bonding vias 280 may have a first width W1 on the second bonding surface B2 bonded to the first substrate structure S1. The first width W1 may be narrower than a second width W2 of the first bonding surface B1 of the bonding metal layers 180, and may range from about 100 nm to about 300 nm. Therefore, a total area of the bonding metal layers 180 on the first bonding surface B1 may be larger than a total area of the bonding vias 280 on the second bonding surface B2. A first height H1 of the bonding vias 280 may be greater than a second height H2 of the bonding metal layers 180. For example, the first height H1 may range from about 3 times to about 10 times the second height H2. For example, the second height H2 may range from about 30 nm to about 100 nm. The bonding vias 280 may be disposed to be spaced apart by a first distance D1 in a direction, parallel to the lower surface of the second substrate 201, for example, in the X direction and/or Y direction. The first distance D1 may be greater than a second distance D2, which may be a separation distance between the bonding metal layers 180. For example, the first distance D1 may be about 5 times or more of the first width W1. The first distance D1 and the second distance D2 may be a minimum distance between the bonding vias 280 and the bonding metal layers 180, respectively.

According to some embodiments, the bonding vias 280 may be arranged in a predetermined pattern on a plan view. The bonding vias 280 may be disposed on the same height level in the first and second regions, and may have the same size or different sizes in the first and second regions. As illustrated in FIG. 2, the bonding vias 280 may include a barrier layer 282 extending from lower surfaces of the second cell interconnection lines 274 along lateral surfaces of via holes, and a via conductive layer 284 at least partially or completely filling the via holes. The barrier layer 282 may include tungsten nitride (WN), tantalum nitride (TaN), titanium nitride (TiN), or combinations thereof. The via conductive layer 284 may include a conductive material such as, for example, copper (Cu).

The second bonding insulating layer 285 may be disposed on the lower surface of the cell region insulating layer 290 to surround a portion including lower portions of the bonding vias 280. A lower surface of the second bonding insulating layer 285 may be exposed from the second bonding surface B2, which may be the lower surface of the second substrate structure S2. The second bonding insulating layer 285 may be disposed to cover or overlap at least a portion of lateral surfaces of the bonding vias 280 and surround the bonding vias 280 in a plan view of the semiconductor device 100. The second bonding insulating layer 285 may be a layer for dielectric-dielectric bonding with the first bonding insulating layer 185 of the first substrate structure S1 and for dielectric-metal bonding with the bonding metal layers 180. As illustrated in FIG. 3B, the second bonding insulating layer 285, together with bonding vias 280, may form the second bonding surface B2 for joining the first substrate structure S1 and the second substrate structure S2. The second bonding insulating layer 285 may also function as a diffusion barrier layer of the bonding vias 280, and may include, for example, at least one of SiO, SiN, SiCN, SiOC, SiON, or SiOCN. In example embodiments, the second bonding insulating layer 285 may include the same material as the first bonding insulating layer 185.

The first and second substrate structures S1 and S2 may be bonded by bonding of the bonding metal layers 180 and the bonding vias 280, bonding of the first bonding insulating layer 185 and the second bonding insulating layer 285, and bonding of the bonding metal layers 180 and the second bonding insulating layer 285, as those of the first bonding surface B1 and the second bonding surface B2 indicated by thick lines in FIG. 2. The bonding between the bonding metal layers 180 and the bonding vias 280 may be, for example, copper (Cu)-copper (Cu) bonding, and the bonding between the first bonding insulating layer 185 and the second bonding insulating layer 285 may be a dielectric-dielectric bonding such as, for example, SiCN—SiCN bonding. Further, the bonding between the bonding metal layers 180 and the second bonding insulating layer 285 may be, for example, copper (Cu)—SiCN bonding. The first and second substrate structures S1 and S2 may be joined by hybrid bonding including copper (Cu)-copper (Cu) bonding, dielectric-dielectric bonding, and/or copper (Cu)-dielectric bonding. Since energy for the copper (Cu)-copper (Cu) bonding may be greater than energy for the SiCN—SiCN bonding, an area of the copper (Cu)-copper (Cu) bonding may be determined in consideration of energy for an entire bonding. For example, an area of the copper (Cu)-copper (Cu) bonding may be less than half of an area of a surface for the entire bonding. For example, on the second bonding surface B2, a total area of the bonding vias 280 may be smaller than a total area of the second bonding insulating layer 285.

In the semiconductor device 100, the bonding metal layers 180 having a relatively small thickness and a relatively wide width and the bonding vias 280 having a via shape may be bonded to further simplify an interconnection structure and further minimize difficulty of a process and occurrence of defects by the process, as compared to a case in which separate bonding pads respectively connected to interconnection lines by vias are bonded to each other.

Figure 4A:
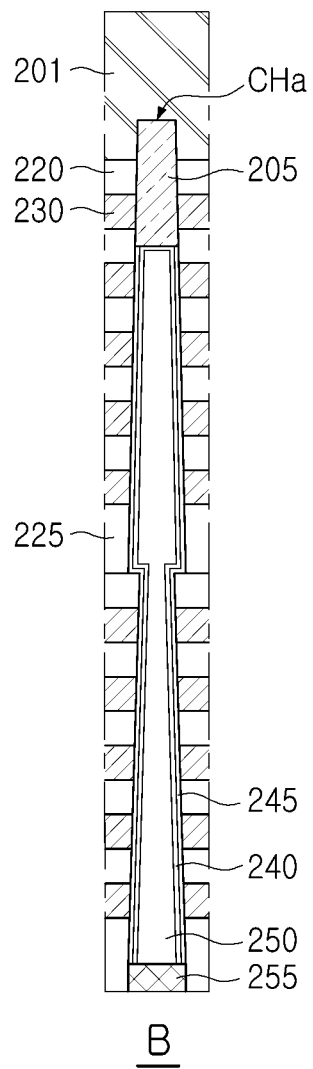
FIGS. 4A and 4B are partially enlarged views illustrating a channel structure of a semiconductor device according to example embodiments.
Figure 4B:
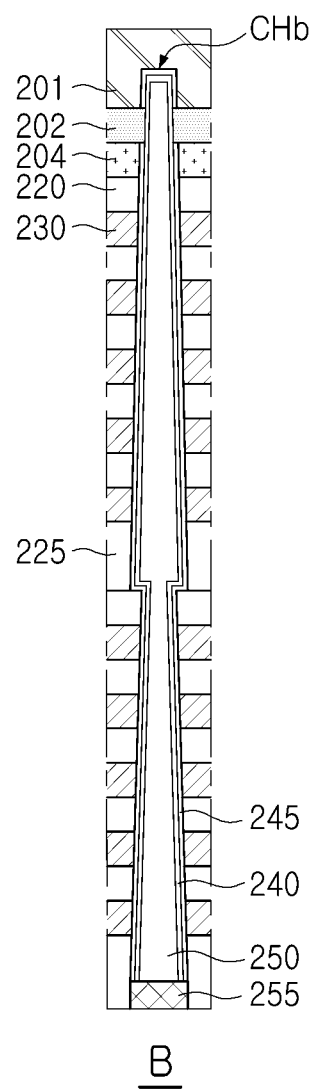

FIGS. 4A and 4B are partially enlarged views illustrating a channel structure of a semiconductor device according to example embodiments. FIGS. 4A and 4B illustrate to enlarge portion 'B' of FIG. 1.

Referring to FIG. 4A, a channel structure CHa may include a channel layer 240, a channel insulating layer 250, a channel pad 255, a gate dielectric layer 245, and an epitaxial layer 205.

The channel layer 240 may be formed in an annular shape surrounding the channel insulating layer 250, but may have a column shape such as a cylinder or a prism without the channel insulating layer 250, according to some embodiments. The channel layer 240 may be connected to the epitaxial layer 205 through an upper portion thereof. The channel layer 240 may include a semiconductor material such as polycrystalline silicon or single crystal silicon, and the semiconductor material may be an undoped material or a material including p-type or n-type impurities.

In the channel structure CHa, the channel pad 255 may be disposed below the channel layer 240. The channel pad 255 may be disposed to cover or overlap a lower surface of the channel insulating layer 250 and be electrically connected to the channel layer 240. The channel pad 255 may include, for example, doped polycrystalline silicon.

The gate dielectric layer 245 may be disposed between the gate electrodes 230 and the channel layer 240. Although not specifically illustrated, the gate dielectric layer 245 may include a tunneling layer, a charge storage layer, and a blocking layer, sequentially stacked on the channel layer 240. The tunneling layer may tunnel charge to the charge storage layer, and may include, for example, silicon oxide ($SiO_2$), silicon nitride ($Si_3N_4$), silicon oxynitride (SiON), or combinations thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or combinations thereof. In example embodiments, at least a portion of the gate dielectric layer 245 may extend along the gate electrodes 230 in a horizontal direction.

The epitaxial layer 205 may be disposed on the lower surface of the second substrate 201 in an upper portion of the channel structure CHa, and may be disposed on a lateral surface or sidewall of at least one of the gate electrodes 230. The epitaxial layer 205 may be disposed in a recessed region of the second substrate 201. With respect to a height level with respect to the second bonding surface B2, a lower surface of the epitaxial layer 205 may be lower than a lower surface of an uppermost gate electrode 230 and may be higher than an upper surface of a gate electrode 230, which is located below the uppermost gate electrode 230, but is not limited to those illustrated. In example embodiments, the epitaxial layer 205 may be omitted. In this case, the channel layer 240 may be directly connected to the second substrate 201, or may be connected to a separate conductive layer on the second substrate 201.

The channel layer 240, the gate dielectric layer 245, and the channel insulating layer 250 may be connected to each other, between a lower channel structure and an upper channel structure. The channel pad 255 may be disposed in a lower portion of the lower channel structure. In example embodiments, the lower channel structure and the upper channel structure may include the channel pad 255, respectively. In this case, the channel pad 255 of the upper channel structure may be connected to the channel layer 240 of the lower channel structure.

Referring to FIG. 4B, unlike the channel structure CHa of FIG. 4A, a channel structure CHb may not include an epitaxial layer 205. In this case, a semiconductor device may further include a horizontal conductive layer 202 and a support layer 204, sequentially disposed on a lower surface of a second substrate 201.

The horizontal conductive layer 202 may function as a portion of a common source line of the semiconductor device, and, together with the second substrate 201, may function, for example, as a common source line. The horizontal conductive layer 202 may be directly connected to a channel layer 240 and may extend around the channel layer 240 in a plan view.

The horizontal conductive layer 202 and the support layer 204 may include a semiconductor material, and may include, for example, polycrystalline silicon. In this case, at least, the horizontal conductive layer 202 may be a doped layer, and the support layer 204 may be a doped layer or a layer including impurities diffused from the horizontal conductive layer 202. According to some embodiments, the support layer 204 may include an insulating material.

Figure 5:
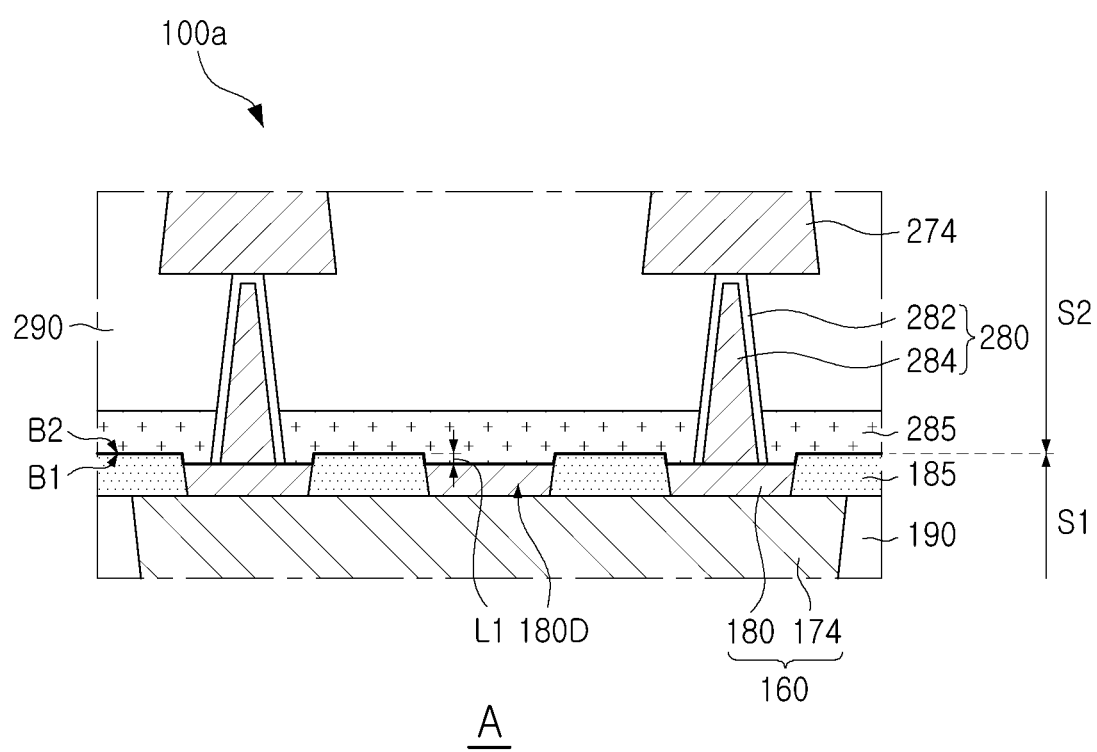
FIG. 5 is a partial enlarged view schematically illustrating a semiconductor device according to example embodiments.

FIG. 5 is a partial enlarged view schematically illustrating a semiconductor device according to example embodiments. FIG. 5 illustrates to enlarge a region corresponding to portion 'A' of FIG. 1.

Referring to FIG. 5, in a semiconductor device 100a, a first bonding surface B1 and a second bonding surface B2 may not be planar, and may have step differences due to a difference in height level.

In a first substrate structure S1, upper surfaces of bonding metal layers 180 may be at a lower height level than upper surfaces of first bonding insulating layer 185 by a first length L1. For example, the bonding metal layers 180 may have a thickness, less than a thickness of the first bonding insulating layer 185. The first length L1 may range from about 1 nm to about 7 nm, for example. Therefore, the bonding metal layers 180 may have a shape recessed into the first bonding insulating layer 185.

In a second substrate structure S2, at least, lower surfaces of bonding vias 280 may further protrude in a downward direction, as compared to a lower surface of a second bonding insulating layer 285 in a region bonded to the first bonding insulating layer 185. The lower surfaces of the bonding vias 280 may be at a lower height level than the lower surface of the second bonding insulating layer 285 in a region bonded to the first bonding insulating layer 185. An interface between the bonding metal layers 180 and the bonding vias 280 may be located on a lower height level than the upper surfaces of the first bonding insulating layers 185. In some embodiments, bonding structures of a metal may be recessed from or protruded to the first bonding surface B1 and the second bonding surface B2 as described above, to perform bonding therebetween more stably.

In example embodiments, before bonding between the first substrate structure S1 and the second substrate structure S2, the second bonding insulating layer 285 may have a lower surface having a planar shape, and the bonding vias 280 may have a shape protruding from the bonding insulating layer 285 in a downward direction. When the first substrate structure S1 and the second substrate structure S2 are bonded, the second bonding insulating layer 285 in a region not bonded to the first bonding insulating layer 185 may be pressed to extend in a downward direction, to fill a space at least partially or completely between the first substrate structure S1 and the second substrate structure S2. Therefore, in a region contacting the bonding metal layers 180, the second bonding insulating layer 285 may also extend in a downward direction. According to some embodiments, in this case, a curvature may also be formed on an upper surface of the second bonding insulating layer 285.

Figure 6A:
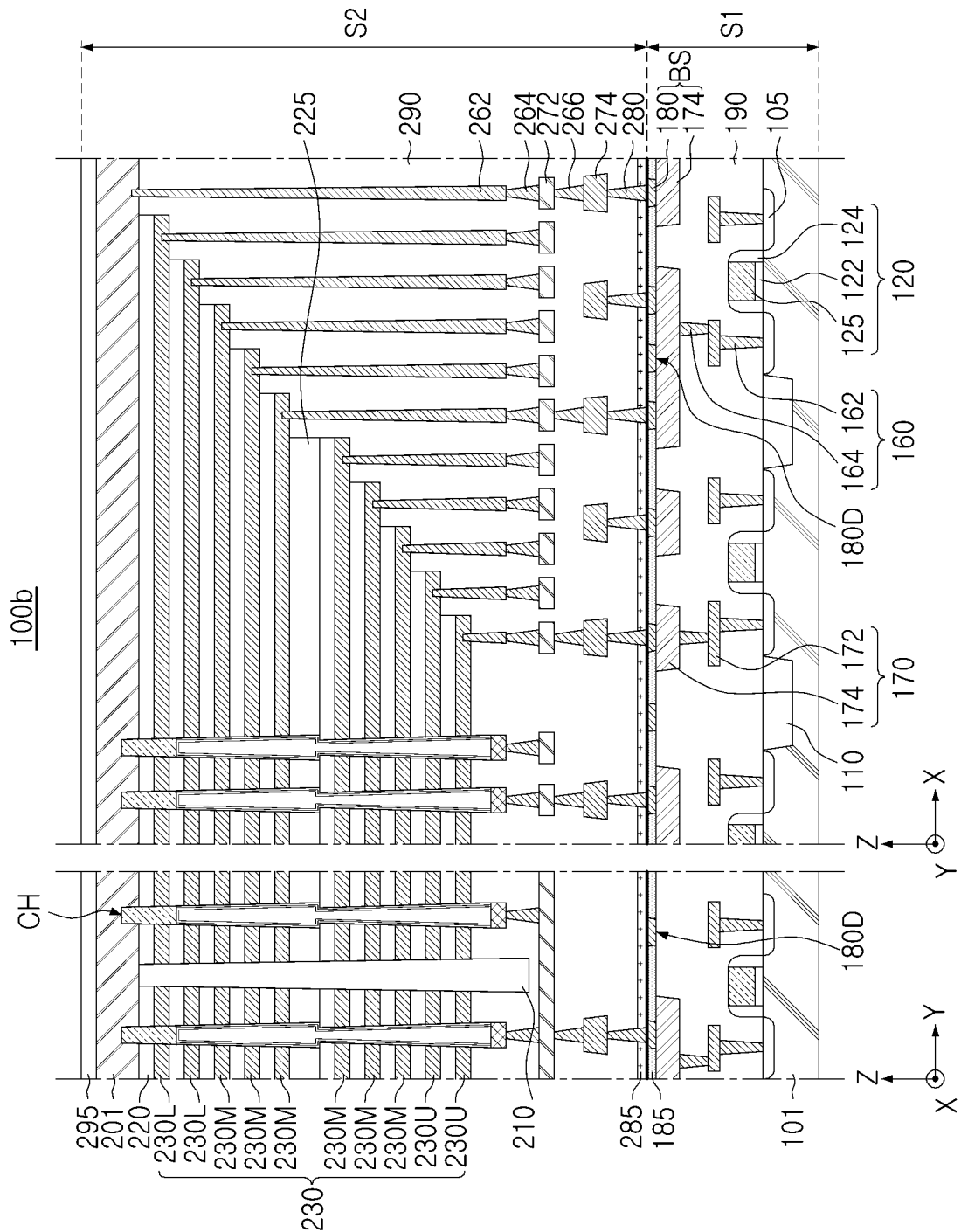
FIGS. 6A and 6B are cross-sectional views schematically illustrating a semiconductor device according to example embodiments.
Figure 6B:
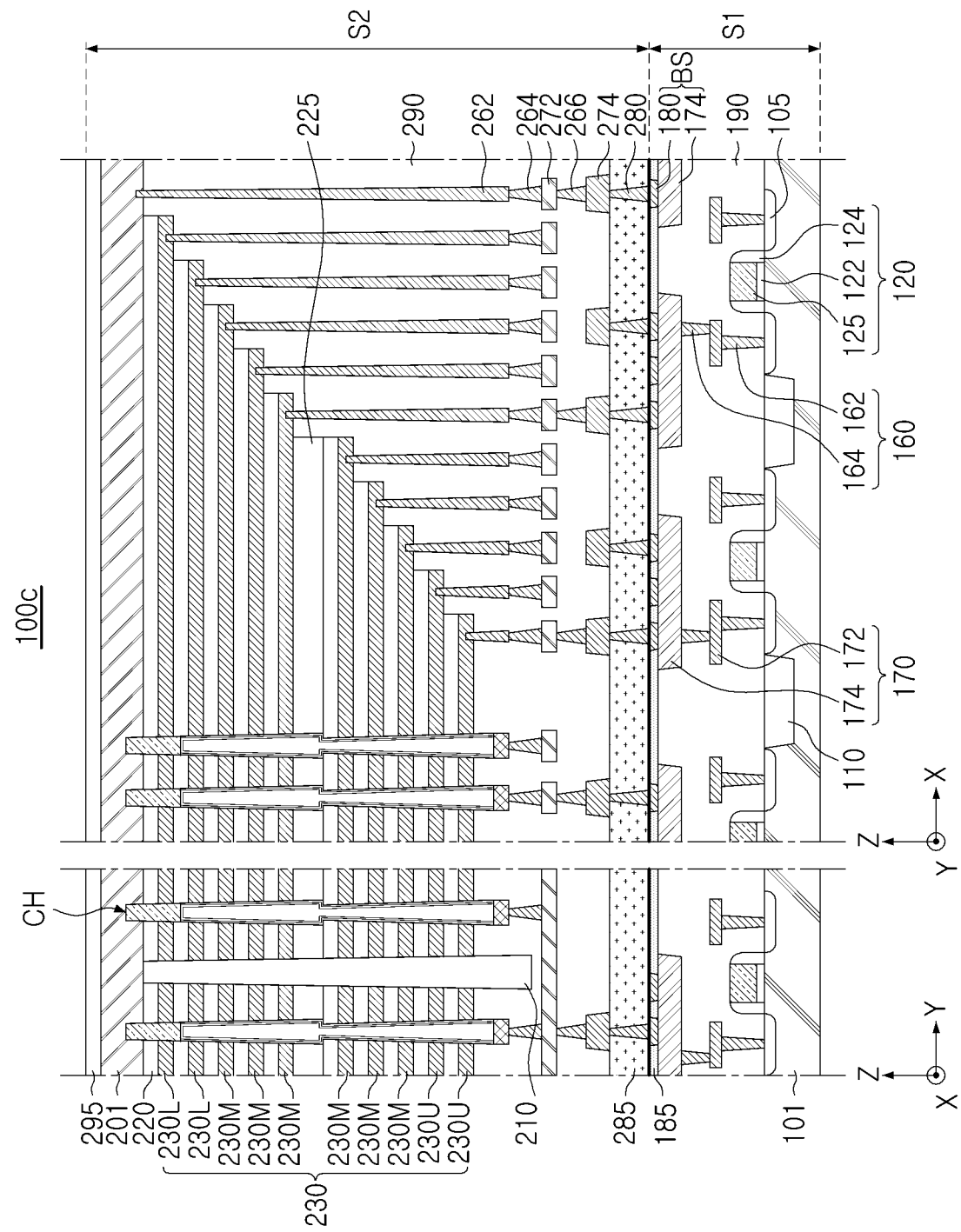

FIGS. 6A and 6B are cross-sectional views schematically illustrating a semiconductor device according to example embodiments.

Referring to FIG. 6A, in a first substrate structure S1 of a semiconductor device 100b, portions of dummy bonding metal layers 180D may not be disposed on second circuit interconnection lines 174, but may be disposed in a first bonding insulating layer 185 on a peripheral region insulating layer 190. The dummy bonding metal layers 180D on the peripheral region insulating layer 190 may be completely surrounded by the peripheral region insulating layer 190, the first bonding insulating layer 185, and/or a second bonding insulating layer 285. Upper surfaces of the dummy bonding metal layers 180D on the peripheral region insulating layer 190 may be exposed from a first bonding surface B1.

The dummy bonding metal layers 180D on the peripheral region insulating layer 190 may have the same size and shape as or similar size and shape to the dummy bonding metal layers 180D on the second circuit interconnection lines 174. However, in example embodiments, a thickness of each of the dummy bonding metal layers 180D on the peripheral region insulating layer 190 may not be the same as a thickness of each of the dummy bonding metal layers 180D on the second circuit interconnection lines 174. For example, the dummy bonding metal layers 180D on the peripheral region insulating layer 190 may have a shape extending relatively deeper in a downward direction, as compared to the dummy bonding metal layers 180D on the second circuit interconnection lines 174. In other words, the dummy bonding metal layers 180D on the peripheral region insulating layer 190 may have a greater thickness extending deeper in a downward direction compared to the dummy bonding metal layers 180D on the second circuit interconnection lines 174. This may be due to partial etching of the peripheral region insulating layer 190 in a process of forming the dummy bonding metal layers 180D described below with reference to FIG. 12B.

In some embodiments, the dummy bonding metal layers 180D may be disposed to have the number or a density, required in consideration of bonding with a second substrate structure S2, regardless of arrangement of the second circuit interconnection lines 174. Features of the dummy bonding metal layers 180D disposed on the peripheral region insulating layer 190 as described above may also be applied to other embodiments including FIG. 6B.

Referring to FIG. 6B, in a semiconductor device 100c, a second bonding insulating layer 285 of a second substrate structure S2 may be disposed between second cell interconnection lines 274 and a first substrate structure S1 to entirely surround bonding vias 280. The second bonding insulating layer 285 may have a thickness, substantially identical to a thickness of each of the bonding vias 280, and may be located on a height level, substantially identical to a height level of the bonding vias 280. A thickness of the second bonding insulating layer 285 may be thicker than a thickness of a first bonding insulating layer 185.

An upper surface of the second bonding insulating layer 285 may be in contact with lower surfaces of the second cell interconnection lines 274. A lower surface of the second bonding insulating layer 285 may be in contact with upper surfaces of the bonding metal layers 180 and an upper surface of the first bonding insulating layer 185. The first bonding insulating layer 185 and the second bonding insulating layer 285 may be disposed to at least partially or completely fill between upper surfaces of second circuit interconnection lines 174 and the lower surfaces of the second cell interconnection lines 274.

According to the structure of some embodiments, since a process of forming a portion of a cell region insulating layer 290 below the second cell interconnection lines 274 may be omitted, a manufacturing process may be further simplified.

Figure 7:
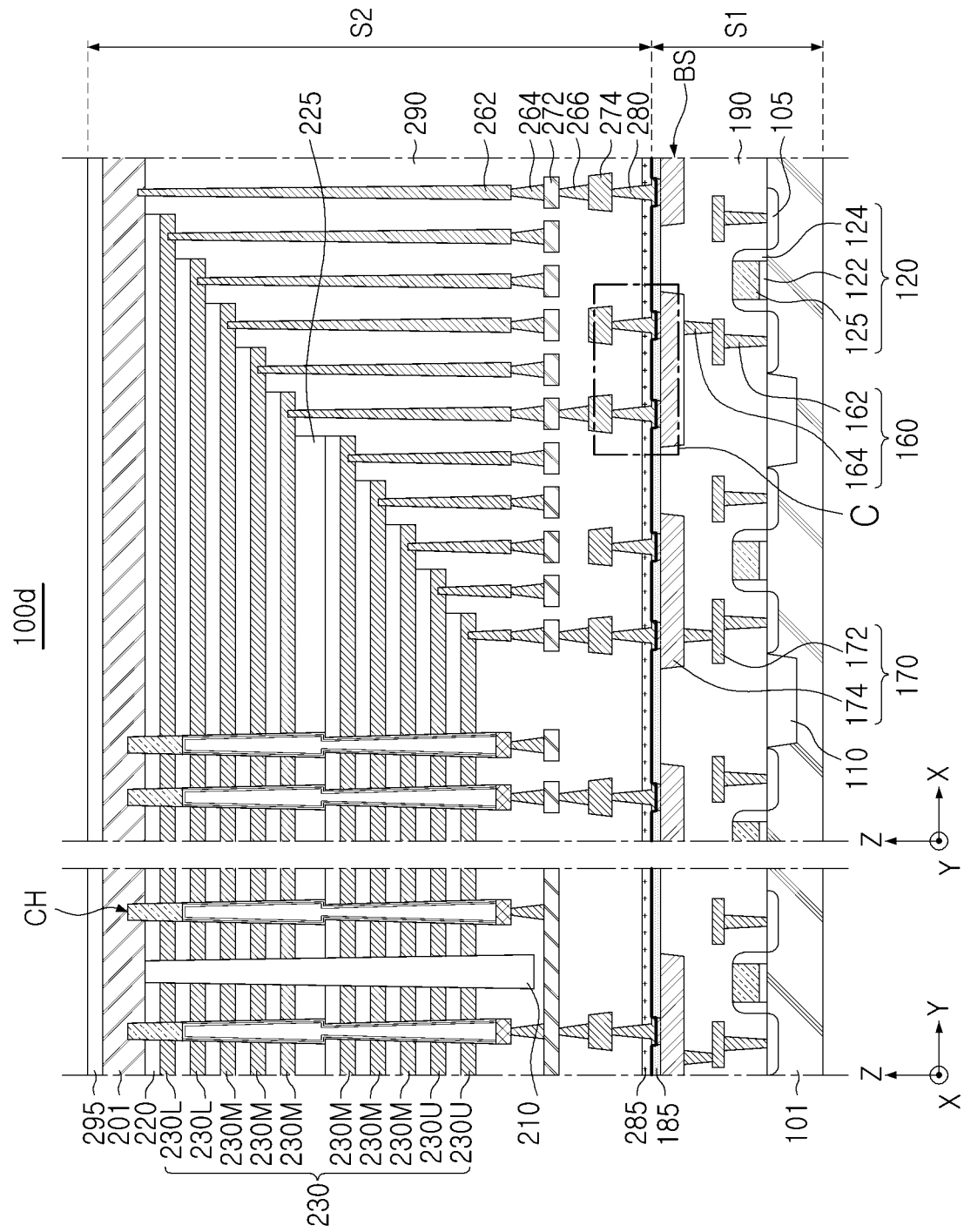
FIG. 7 is a cross-sectional view schematically illustrating a semiconductor device according to example embodiments.
Figure 8:
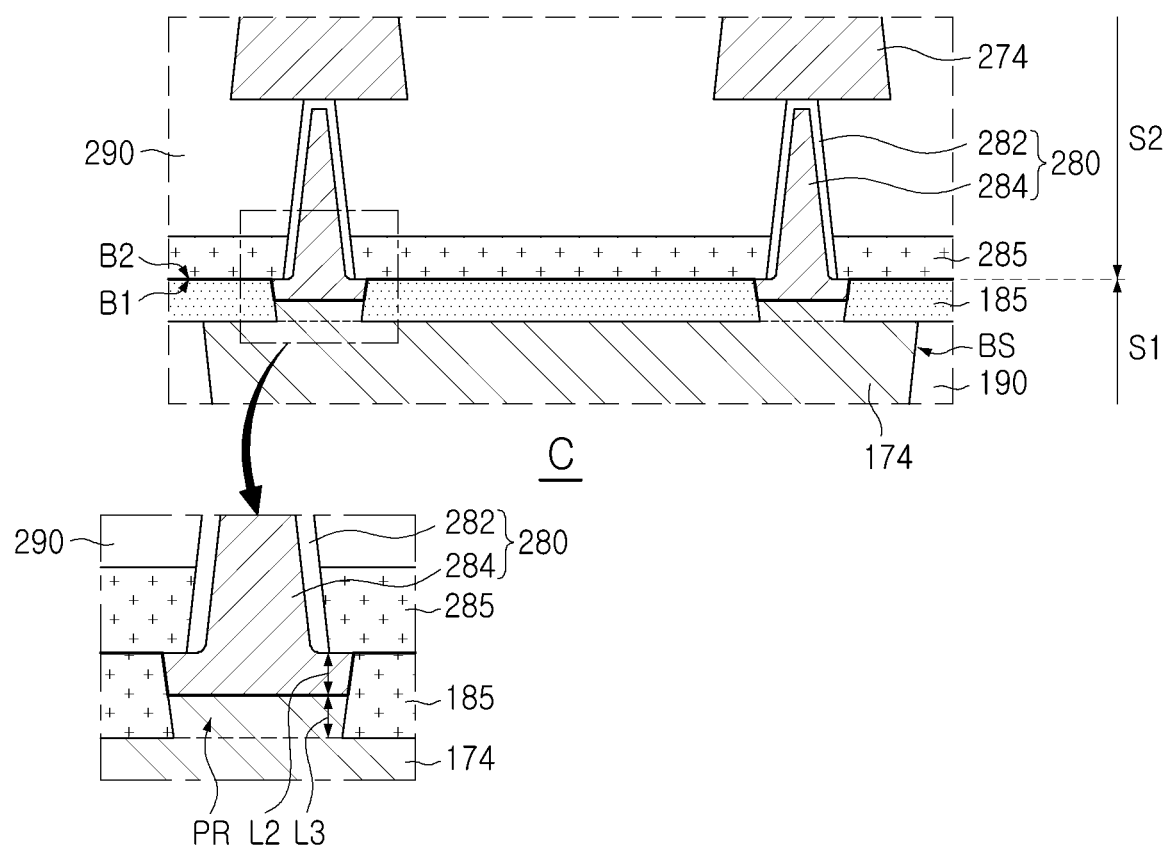
FIG. 8 is a partial enlarged view schematically illustrating a semiconductor device according to example embodiments.
Figure 9A:
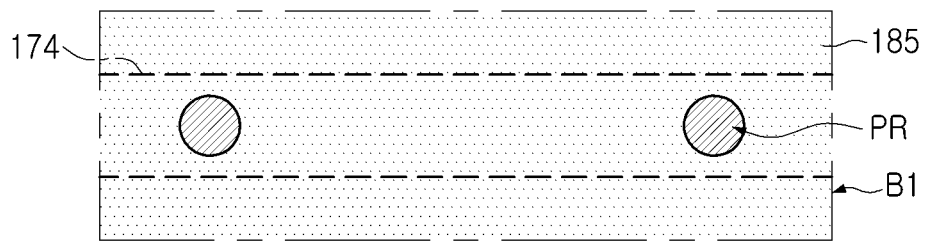
FIGS. 9A and 9B are plan views illustrating bonding surfaces of a semiconductor device according to example embodiments.
Figure 9B:
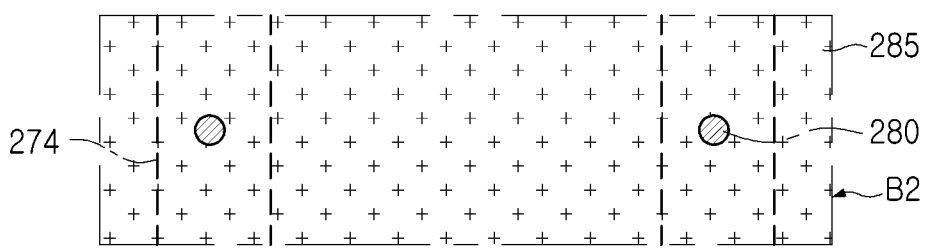

FIG. 7 is a cross-sectional view schematically illustrating a semiconductor device according to example embodiments. FIG. 8 is a partial enlarged view schematically illustrating a semiconductor device according to example embodiments. FIG. 8 illustrates to enlarge portion 'C' of FIG. 7. FIGS. 9A and 9B are plan views illustrating bonding surfaces of a semiconductor device according to example embodiments.

Referring to FIGS. 7 to 9B, a first substrate structure S1 in a semiconductor device 100d may include only second circuit interconnection lines 174 as a bonding structure BS. For example, unlike the embodiments of FIGS. 1 to 3B, the first substrate structure S1 may not include bonding metal layers 180. In this case, when the first substrate structure S1 and a second substrate structure S2 are bonded, a material forming the second circuit interconnection lines 174 may be partially expanded and extended in an upward direction from upper surfaces of the second circuit interconnection lines 174 exposed from a first bonding insulating layer 185. Further, a via conductive layer 284 of bonding vias 280 may also be expanded and extended in a downward direction to finally form a first bonding surface B1 and a second bonding surface B2. The expansion of the second circuit interconnection lines 174 and the expansion of the bonding vias 280 may be thermal expansion due to heat during bonding. Therefore, the first bonding surface B1 and the second bonding surface B2 may not be planar, and may have step differences due to a difference in height levels.

As illustrated in FIGS. 8 and 9A, the second circuit interconnection lines 174 may have protrusions PR expanding and protruding from an upper surface of the second circuit interconnection lines 174 in an upward direction. A protruding length L2 of the bonding vias 280 protruding in a downward direction may be identical to or different from a protruding length L3 of each of the protrusions PR of the second circuit interconnection lines 174, but are not limited to the height levels illustrated in FIG. 8. In the bonding vias 280, the via conductive layer 284 may further extend in a lateral direction, as compared to a barrier layer 282, but is not limited thereto.

The first and second substrate structures S1 and S2 may be bonded by bonding of the second circuit interconnection lines 174 and the bonding vias 280 and bonding of the first bonding insulating layer 185 and a second bonding insulating layer 285. According to example embodiments, the protrusions PR of the second circuit interconnection lines 174 may include dummy protrusions bonded to the second bonding insulating layer 285, not bonded to the bonding vias 280. Also, in these embodiments, a total area of the second circuit interconnection lines 174 exposed from the first bonding surface B1, e.g., a total area of the protrusions PR, may be larger than a total area of the bonding vias 280 on the second bonding surface B2. Also, on the second bonding surface B2, the total area of the bonding vias 280 may be smaller than a total area of the second bonding insulating layer 285.

In the semiconductor device 100d, since the first substrate structure S1 does not include bonding metal layers, a manufacturing process may be easier and a height level of the semiconductor device 100d may be reduced.

Figure 10A:
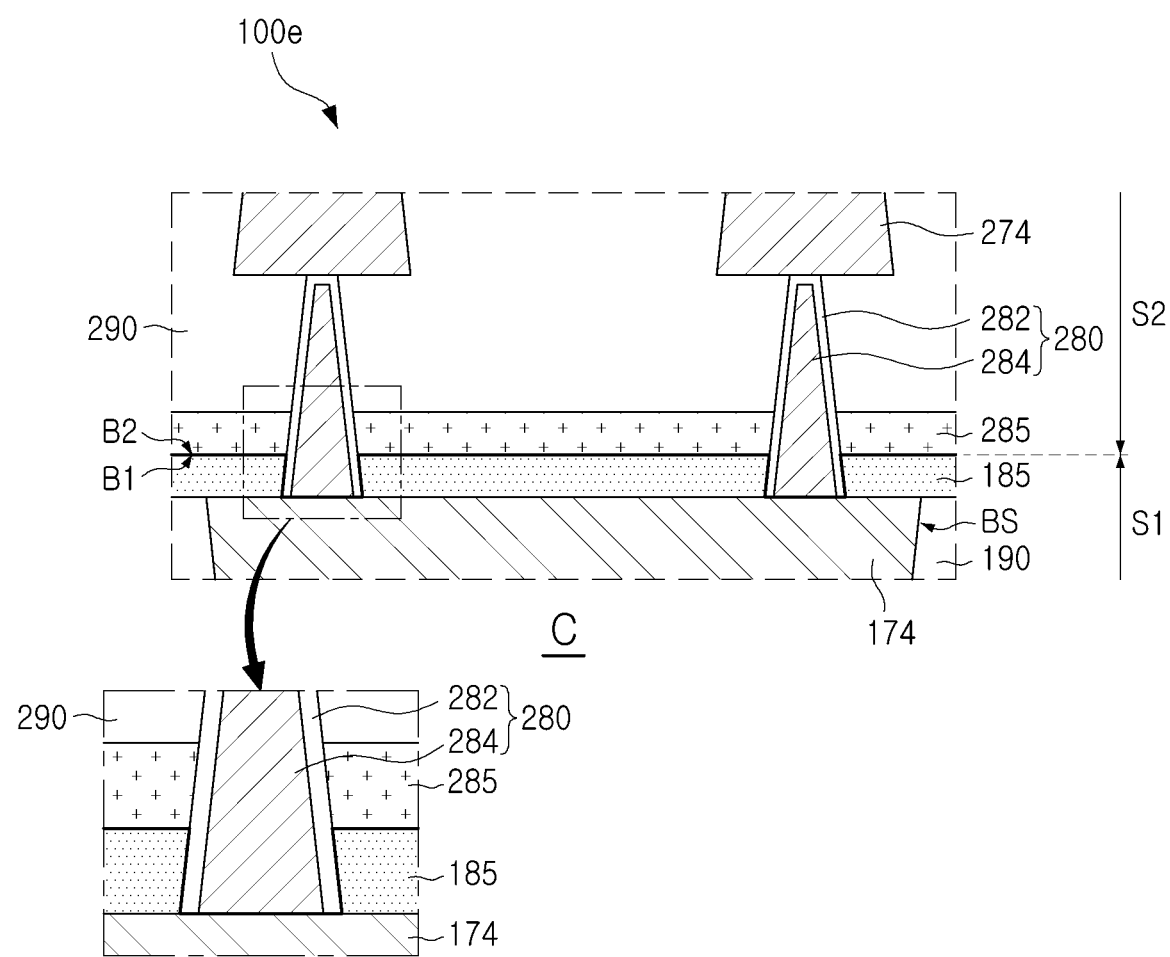
FIGS. 10A and 10B are partially enlarged views schematically illustrating a semiconductor device according to example embodiments.
Figure 10B:
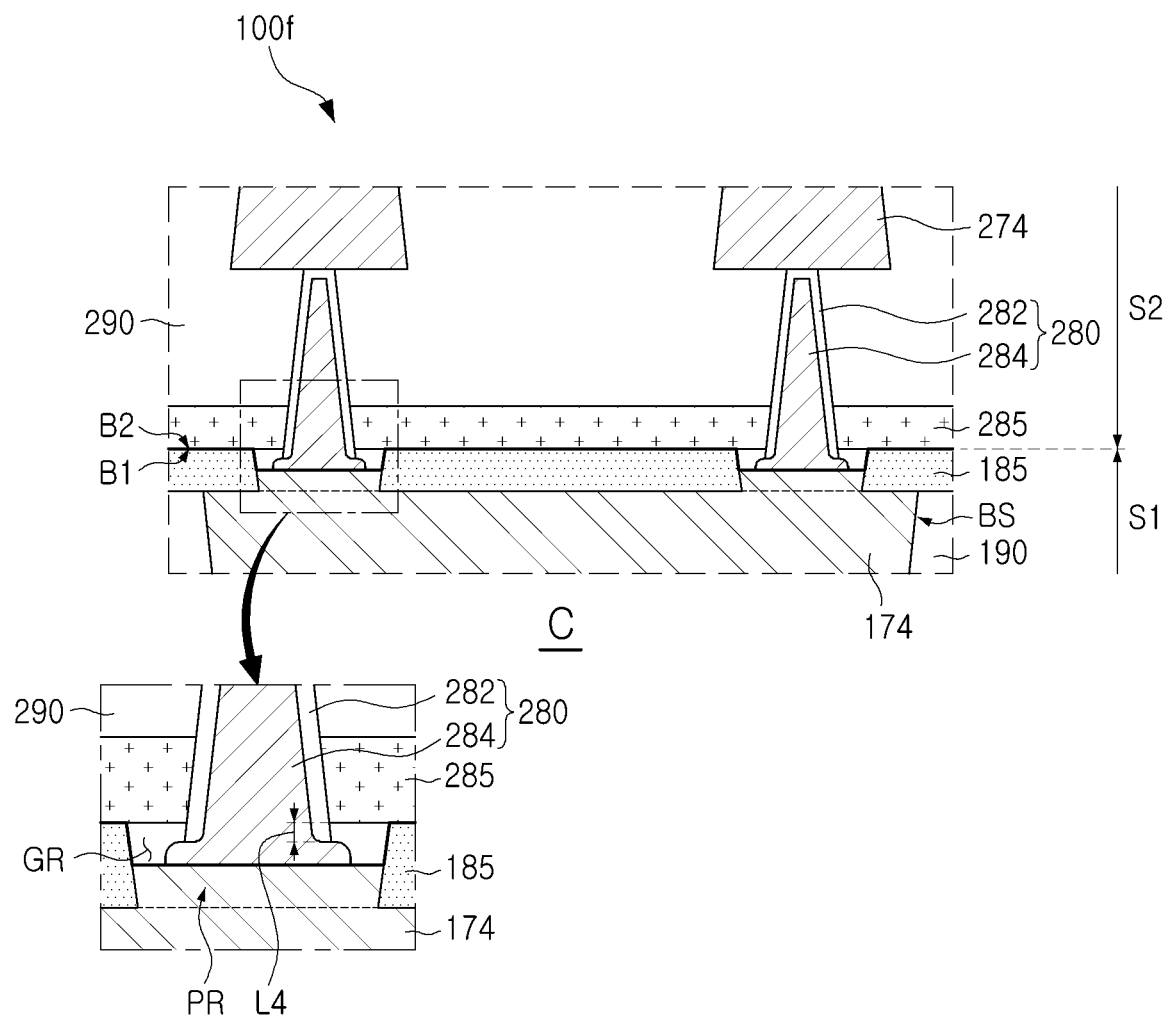

FIGS. 10A and 10B are partially enlarged views schematically illustrating a semiconductor device according to example embodiments. FIGS. 10A and 10B illustrates to enlarge a region corresponding to portion 'C' of FIG. 7.

Referring to FIG. 10A, unlike the embodiment of FIG. 8, in a semiconductor device 100e, second circuit interconnection lines 174 may not have protrusions PR. Lower surfaces of bonding vias 280 of a second substrate structure S2 may have a structure protruding from a lower surface of a second bonding insulating layer 285. Therefore, the second circuit interconnection lines 174 may be bonded to lower surfaces of bonding vias 280 through a planar upper surface of the second circuit interconnection lines 174. This structure may be determined according to a material of the second circuit interconnection lines 174 and a material of the bonding vias 280. According to example embodiments, the bonding vias 280 may be partially expanded in a downward direction to be bonded to the second circuit interconnection lines 174.

Referring to FIG. 10B, in a semiconductor device 100f, lower surfaces of bonding vias 280 of a second substrate structure S2 may have a protruding structure having a predetermined length L4 below a lower surface of a second bonding insulating layer 285. In addition, a via conductive layer 284 of each of the bonding vias 280 may be expanded and extended in a downward direction during bonding, similarly to the embodiment of FIG. 8.

Unlike the embodiment of FIG. 8, an air gap region GR may be formed around the bonding vias 280. As used herein, "air gap" may refer to a void or cavity, a gap filled with air or gas (e.g., an inert gas), or a gap defining a vacuum. This may be because, for example, areas of second circuit interconnection lines 174 exposed from a first bonding insulating layer 185 may be relatively large. In example embodiments, depending on relative sizes of bonding vias 280 and protrusions PR, a material of the bonding vias 280, a material of the second circuit interconnection lines 174, a material of the second bonding insulating layer 285, bonding process conditions, or the like, the second bonding insulating layer 285 may be extended in a downward direction as in the embodiment of FIG. 8, or the air gap region GR may be formed around the bonding vias 280 as in FIG. 10B.

Figure 11:
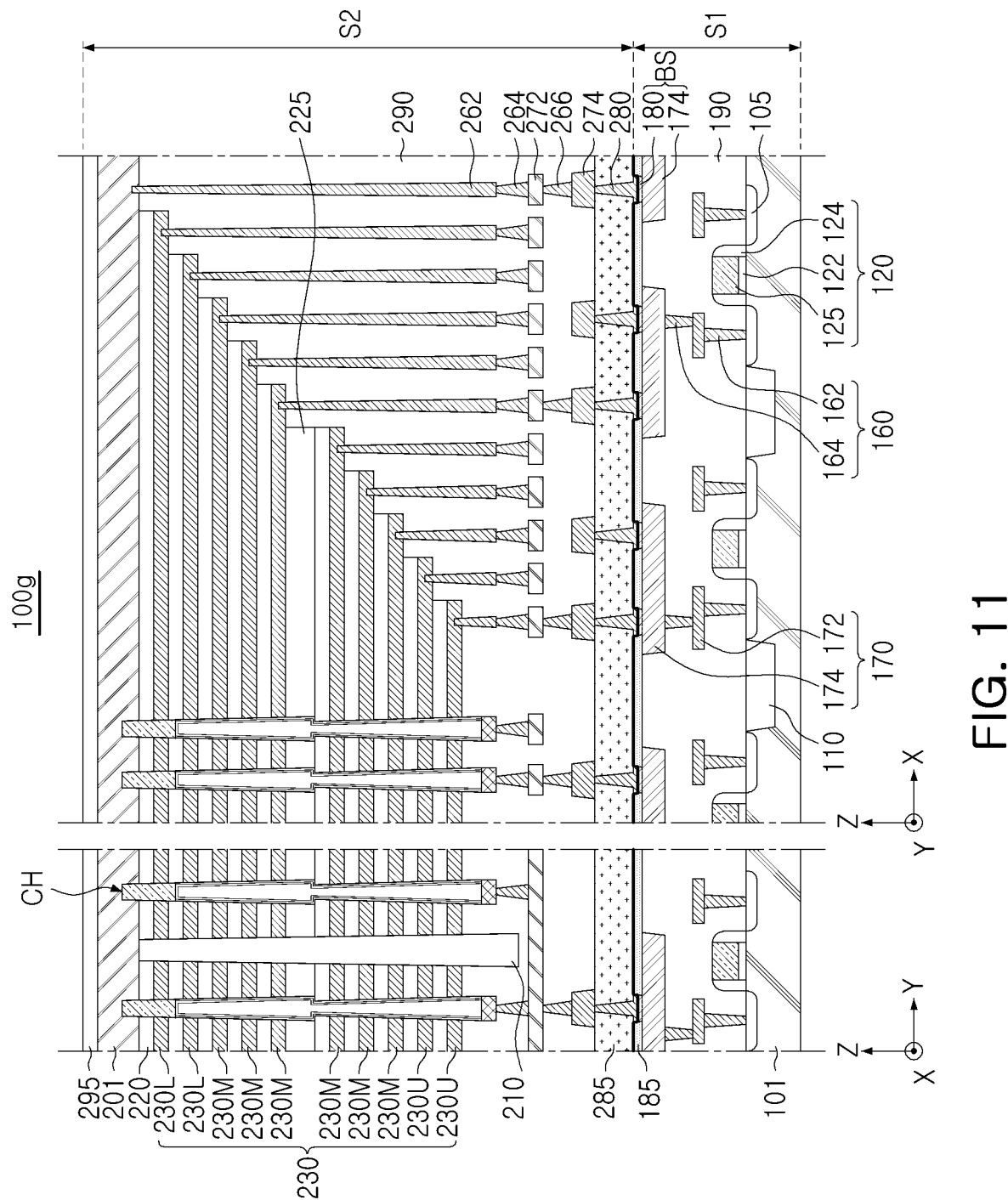
FIG. 11 is a cross-sectional view schematically illustrating a semiconductor device according to example embodiments.

FIG. 11 is a cross-sectional view schematically illustrating a semiconductor device according to example embodiments.

Referring to FIG. 11, in a semiconductor device 100g, a second bonding insulating layer 285 of a second substrate structure S2 may be disposed between second cell interconnection lines 274 and a first substrate structure S1 to entirely surround bonding vias 280. Therefore, an upper surface of the second bonding insulating layer 285 may be in contact with lower surfaces of the second cell interconnection lines 274. A lower surface of the second bonding insulating layer 285 may be in contact with an upper surface of a first bonding insulating layer 185. The first bonding insulating layer 185 and the second bonding insulating layer 285 may be disposed to at least partially or completely fill between upper surfaces of second circuit interconnection lines 174 and the lower surfaces of the second cell interconnection lines 274.

According to the structure of FIG. 11, since a process of forming a portion of a cell region insulating layer 290 below the second cell interconnection lines 274 may be omitted, a manufacturing process may be further simplified.

FIGS. 12A to 12L are cross-sectional views schematically illustrating a method of manufacturing a semiconductor device according to example embodiments. FIGS. 12A to 12L illustrate a region corresponding to FIG. 1.

Figure 12A:
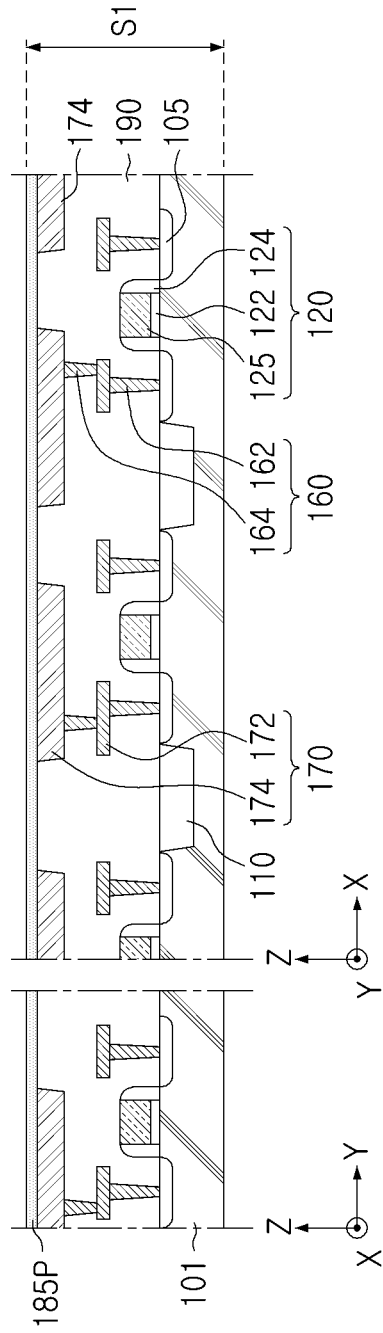

Referring to FIG. 12A, first, in order to form a first substrate structure S1, circuit devices 120 and circuit interconnection structures may be formed on a first substrate 101.

Specifically, device isolation layers 110 may be formed on the first substrate 101. The device isolation layers 110 may be formed by etching a portion of the first substrate 101 to form trenches, and then at least partially or completely filling the trenches with an insulating material. Next, a circuit gate dielectric layer 122 and a circuit gate electrode 125 may be sequentially formed on the first substrate 101. The circuit gate dielectric layer 122 and the circuit gate electrode 125 may be formed using atomic layer deposition (ALD) or chemical vapor deposition (CVD). The circuit gate dielectric layer 122 may be formed of silicon oxide, and the circuit gate electrode 125 may be formed of at least one of a polysilicon layer or a metal silicide layer, but are not limited thereto. Next, a spacer layer 124 and source/drain regions 105 may be formed on or adjacent to both sidewalls of the circuit gate dielectric layer 122 and/or both sidewalls of the circuit gate electrode 125. According to some embodiments, the spacer layer 124 may be formed as a plurality of layers. The source/drain regions 105 may be formed by performing an ion implantation process.

Among the circuit interconnection structures, circuit contact plugs 160 may be formed by partially forming a peripheral region insulating layer 190, partially etching and removing the formed peripheral region insulating layer 190, and at least partially or completely filling a conductive material therein. Circuit interconnection lines 170 may be formed by, for example, depositing a conductive material and then patterning the deposited conductive material.

The peripheral region insulating layer 190 may be formed of a plurality of insulating layers. The peripheral region insulating layer 190 may be partially formed in each operation of forming the circuit interconnection structures, to finally cover or overlap portions of the circuit devices 120 and/or portions of the circuit interconnection structures.

A first preliminary bonding insulating layer 185P may be formed on the peripheral region insulating layer 190 and the second circuit interconnection lines 174. The first preliminary bonding insulating layer 185P may be formed to entirely cover or entirely overlap an upper surface of the peripheral region insulating layer 190 and/or an upper surface of the second circuit interconnection lines 174.

Figure 12B:
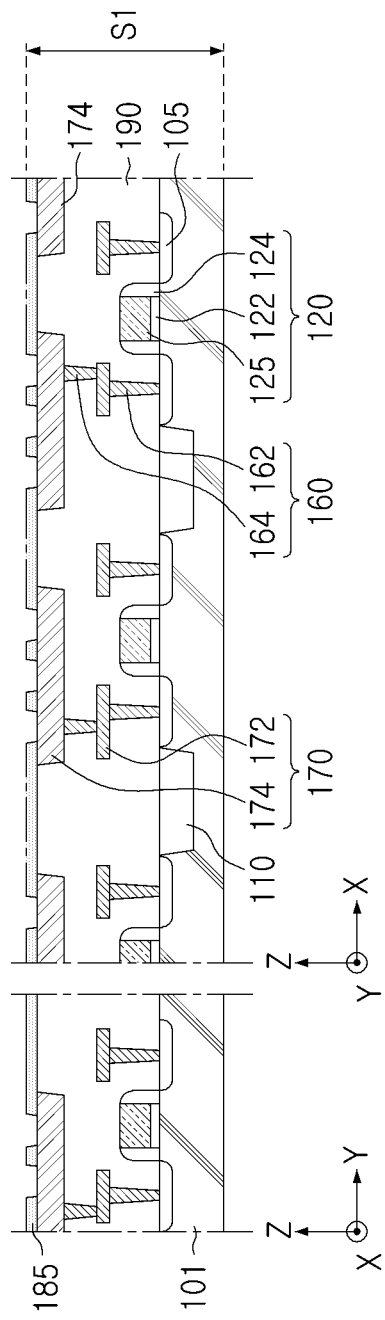

Referring to FIG. 12B, the first preliminary bonding insulating layer 185P may be patterned to form a first bonding insulating layer 185.

The first bonding insulating layer 185 may be formed by patterning the first preliminary bonding insulating layer 185P using a separate mask layer. Portions of upper surfaces of second circuit interconnection lines 174 may be exposed in an upward direction through the first bonding insulating layer 185.

Figure 12C:
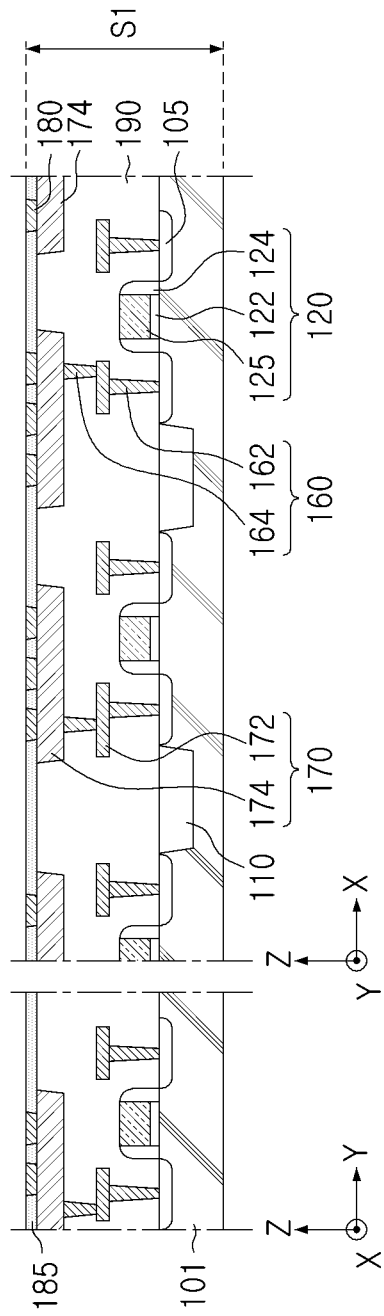

Referring to FIG. 12C, bonding metal layers 180 may be formed on the second circuit interconnection lines 174.

The bonding metal layers 180 may be formed on the second circuit interconnection lines 174 exposed through the first bonding insulating layer 185. The bonding metal layers 180 may be formed by a deposition process or a plating process. When the bonding metal layers 180 are formed by a plating process, a seed layer may be formed first. The first bonding insulating layer 185 may also function as a diffusion barrier layer for the bonding metal layers 180.

After the bonding metal layers 180 are formed, a heat treatment process and a planarization process may be further performed. The planarization process may be, for example, a chemical mechanical polishing (CMP) process. During the planarization process, the bonding metal layers 180 may be formed such that upper surfaces thereof are coplanar with an upper surface of the first bonding insulating layer 185 or are partially recessed from the first bonding insulating layer 185. When the bonding metal layers 180 are formed to have upper surfaces on a lower height level than the first bonding insulating layer 185, the semiconductor device of the example embodiment of FIG. 5 may be manufactured. The upper surfaces of the bonding metal layers 180 may be exposed through the first bonding insulating layer 185, and may form a portion of an upper surface of the first substrate structure S1. By this operation, the first substrate structure S1 may be prepared.

Figure 12D:
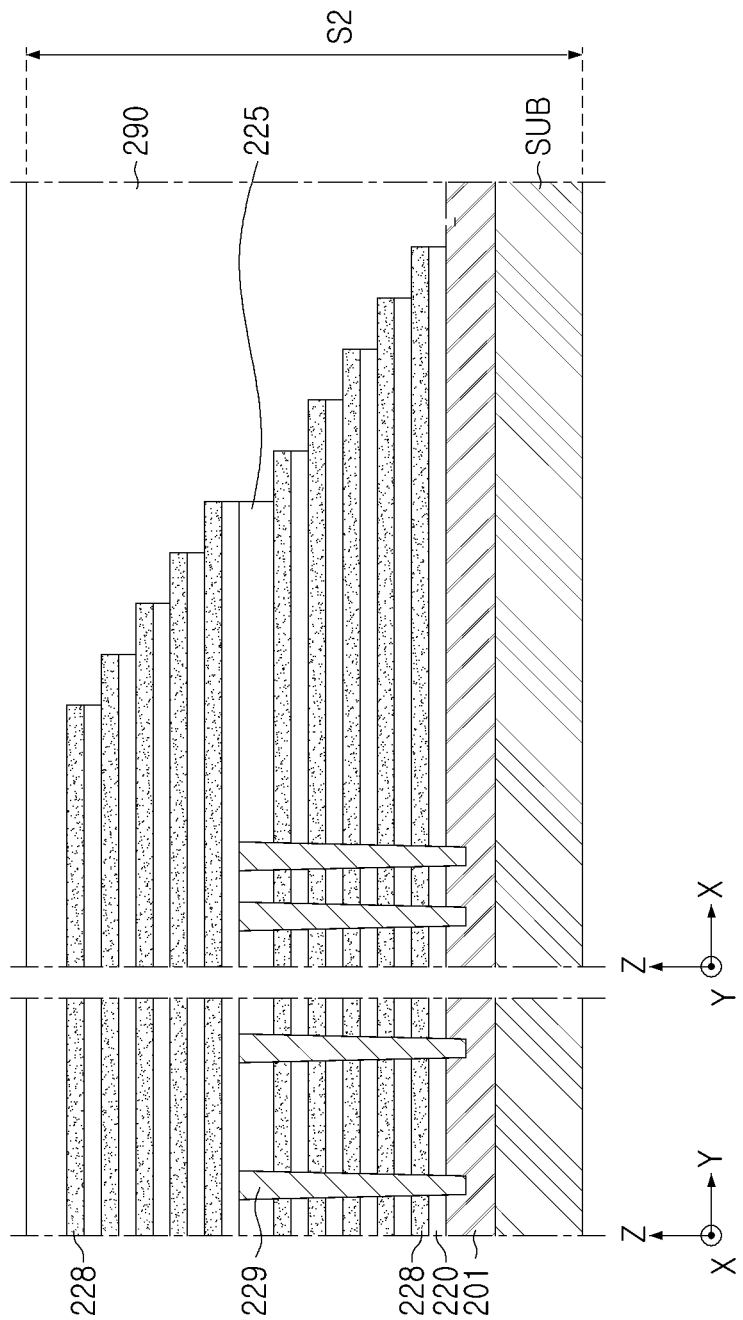

Referring to FIG. 12D, a process of manufacturing a second substrate structure S2 may be started. First, a second substrate 201 may be formed on a base substrate SUB, sacrificial layers 228 and interlayer insulating layers 220 may be alternately stacked, and then channel sacrificial layers 229 may be formed.

The base substrate SUB may be a layer to be removed through a subsequent process, and may be a semiconductor substrate such as silicon (Si). The second substrate 201 may be formed of, for example, a polycrystalline silicon layer or an epitaxial layer. In this operation, a passivation layer 295 (refer to FIG. 1) and/or a separate cover layer or an etch stop layer may be formed before forming the second substrate 201. The example embodiment of FIG. 4B may be accomplished by further forming a horizontal conductive layer 202 and a support layer 204 on the second substrate 201 in this operation.

The sacrificial layers 228 may be alternately formed with the interlayer insulating layers 220, to form a lower stack structure and an upper stack structure. After the lower stack structure is formed, a connection insulating layer 225 and the channel sacrificial layers 229 may be formed, and the upper stack structure may be formed.

The sacrificial layers 228 may be layers to be replaced with gate electrodes 230 by a subsequent process. The sacrificial layers 228 may be formed of a material capable of being etched with etch selectivity with respect to the interlayer insulating layers 220. For example, the interlayer insulating layer 220 may be formed of at least one of silicon oxide or silicon nitride, and the sacrificial layers 228 may be selected from silicon, silicon oxide, silicon carbide, and/or silicon nitride, but may be formed of materials, different from those of the interlayer insulating layer 220. In some embodiments, the interlayer insulating layers 220 may not all have the same thickness. The connection insulating layer 225 may include a material having etch selectivity with respect to the sacrificial layers 228, for example, the same material as the interlayer insulating layers 220.

The channel sacrificial layers 229 may be prepared by forming lower channel holes to pass through the lower stack structure in a region corresponding to a lower region of channel structures CH (refer to FIG. 1), and then depositing a material of the channel sacrificial layers 229 on the lower channel holes. The channel sacrificial layers 229 may include, for example, polycrystalline silicon.

Next, a photolithography process and an etching process for the sacrificial layers 228 and the interlayer insulating layers 220 may be repeated such that upper sacrificial layers 228 extend shorter than lower sacrificial layers 228. Therefore, the sacrificial layers 228 may have a step shape. In example embodiments, the sacrificial layers 228 may be formed to have a relatively thick thickness in end portions thereof, and a process for this may be further performed. Next, an insulating material may be deposited to cover or overlap an upper portion of a stack structure of the sacrificial layers 228 and the interlayer insulating layers 220, to form a cell region insulating layer 290.

Referring to FIG. 12E, channel structures CH passing through the stack structure of the sacrificial layers 228 and the interlayer insulating layers 220 may be formed.

First, the upper stack structure may be anisotropically etched to form upper channel holes on the channel sacrificial layers 229 shown in FIG. 12D, and the channel sacrificial layers 229 exposed through the upper channel holes may be removed. Therefore, channel holes to which the lower channel holes and the upper channel holes are connected may be formed.

Next, an epitaxial layer 205, a channel layer 240, a gate dielectric layer 245, a channel insulating layer 250, and channel pads 255 may be formed in the channel holes to prepare channel structures CH. The epitaxial layer 205 may be formed using selective epitaxial growth (SEG). The epitaxial layer 205 may be formed as a single layer or as a plurality of layers. The epitaxial layer 205 may include polycrystalline silicon, monocrystalline silicon, polycrystalline germanium, or monocrystalline germanium doped or undoped with impurities. The gate dielectric layer 245 may be formed to have a uniform thickness using ALD or CVD. In this operation, at least a portion of the gate dielectric layer 245 extending vertically along the channel layer 240 may be formed. The channel layer 240 may be formed on the gate dielectric layer 245 in the channel structures CH. The channel insulating layer 250 may be formed to at least partially or completely fill the channel structures CH, and may be formed of an insulating material. According to some embodiments, a space between channel layers 240 may be embedded with a conductive material other than the channel insulating layer 250. The channel pads 255 may be formed of a conductive material, for example, polycrystalline silicon.

Figure 12F:
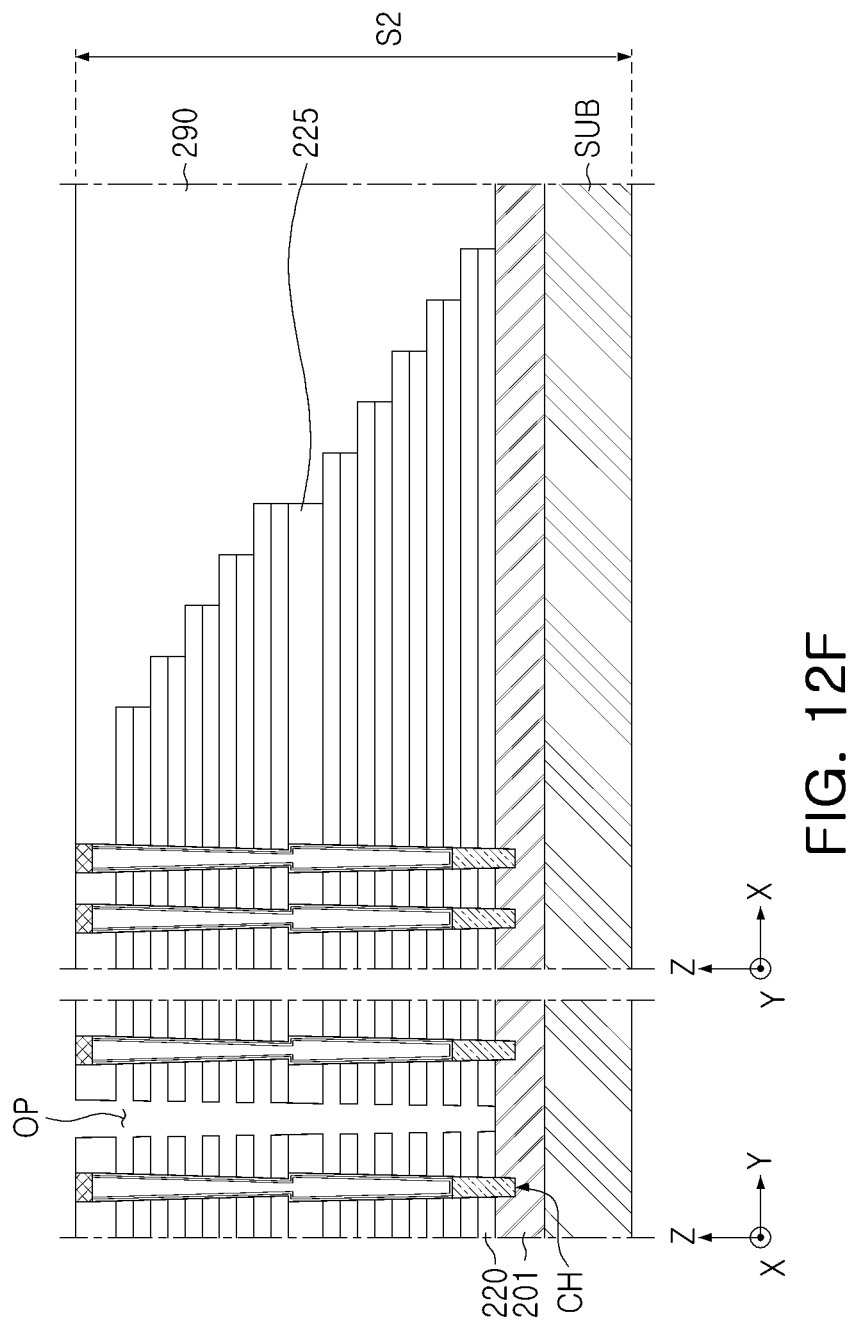

Referring to FIG. 12F, an opening OP passing through the stack structure of the sacrificial layers 228 and the interlayer insulating layers 220 may be formed, and the sacrificial layers 228 may be removed through the opening OP.

The opening OP may be formed in a region corresponding to a separation region 210 (refer to FIG. 1), and may be formed in a trench shape extending in the X direction. The sacrificial layers 228 may be selectively removed with respect to the interlayer insulating layers 220 and the connection insulating layer 225 using, for example, wet etching. Therefore, sidewalls of the channel structures CH may be partially exposed between the interlayer insulating layers 220.

Figure 12G:
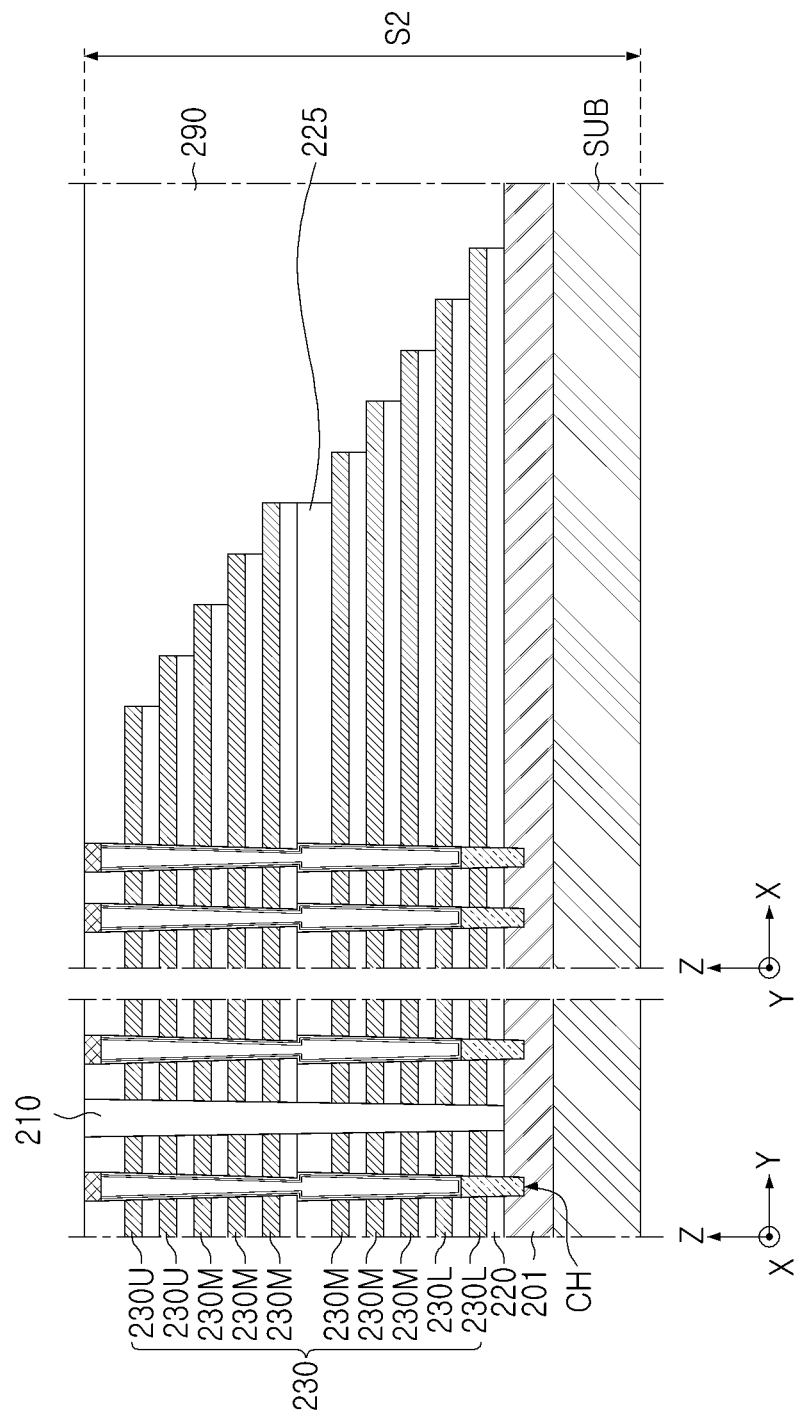

Referring to FIG. 12G, gate electrodes 230 may be formed in a region from which the sacrificial layers 228 are removed.

The gate electrodes 230 may be formed by at least partially or completely filling a conductive material in a region from which the sacrificial layers 228 are removed. The gate electrodes 230 may include a metal, polycrystalline silicon, or metal silicide material. In example embodiments, before the formation of the gate electrodes 230, when a region of the gate dielectric layer 245 extending horizontally on the second substrate 201 along the gate electrodes 230 is present, the region may be formed preferentially.

Next, an insulating material may be at least partially or completely filled or deposited in the opening OP to form a separation region 210.

Figure 12H:
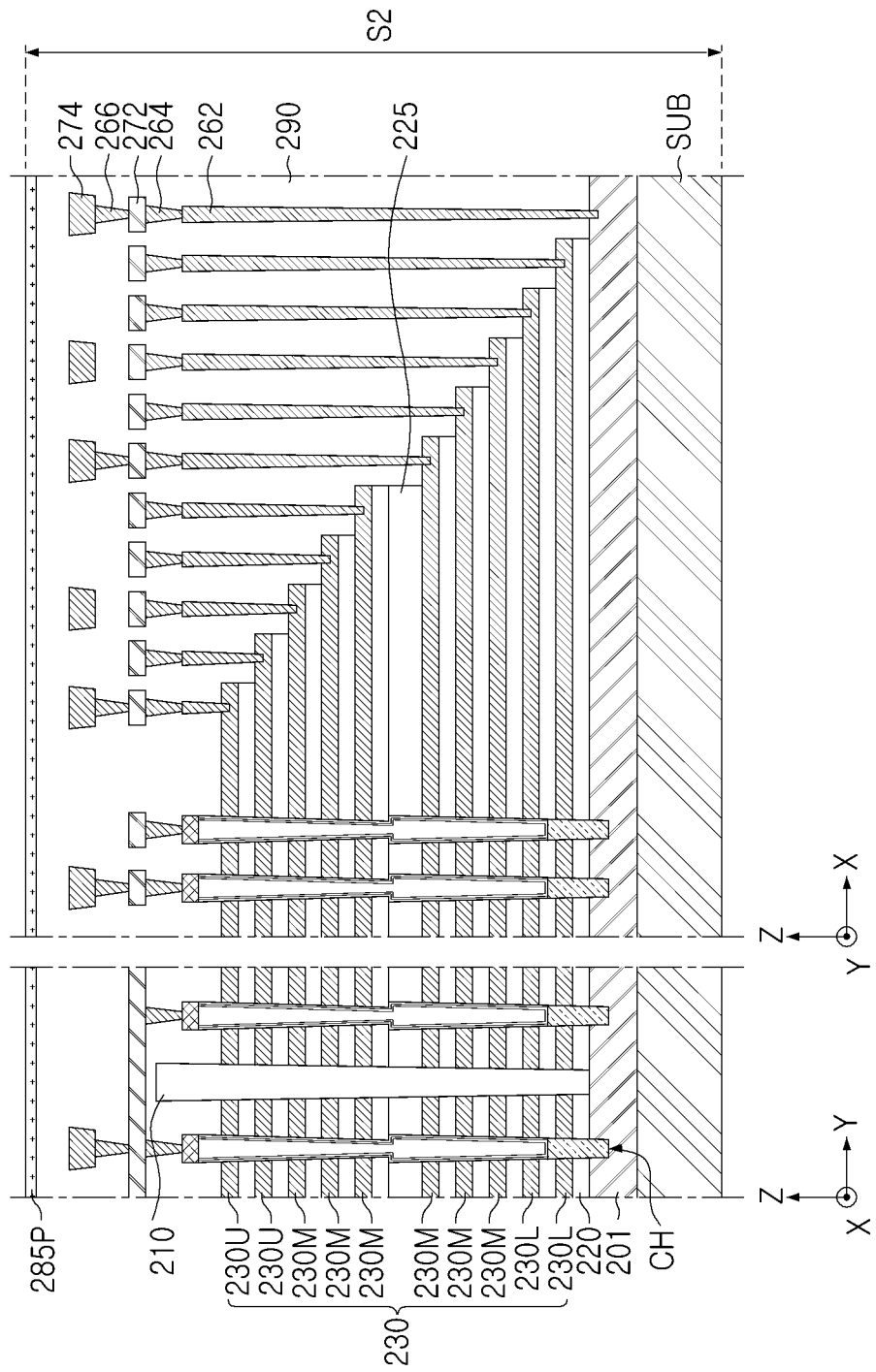

Referring to FIG. 12H, first to third cell contact plugs 262, 264, and 266 and first and second cell interconnection lines 272 and 274, which may be portions of an interconnection structure on the gate electrodes 230, may be formed.

The first cell contact plugs 262 may be formed by etching the cell region insulating layer 290 on the gate electrodes 230 and the second substrate 201 to form a contact hole, and at least partially or completely filling a conductive material in the contact hole. The second cell contact plugs 264 may be formed by etching the cell region insulating layer 290 on the channel pads 155 and the first cell contact plugs 262 and depositing a conductive material thereon. The third cell contact plugs 266 may be formed by etching the cell region insulating layer 290 on the first cell interconnection lines 272 and depositing a conductive material thereon.

The first and second cell interconnection lines 272 and 274 may be formed by a process of depositing and patterning a conductive material, or may be formed by partially forming an insulating layer that are part of the cell region insulating layer 290, patterning the insulating layer, and depositing a conductive material thereon.

After further forming the cell region insulating layer 290 on the second cell interconnection lines 274, a second preliminary bonding insulating layer 285P may be formed. In this operation, when the second preliminary bonding insulating layer 285P is directly formed on the second cell interconnection lines 274, the semiconductor device 100c of the embodiment of FIG. 6B may be manufactured.

Figure 12I:
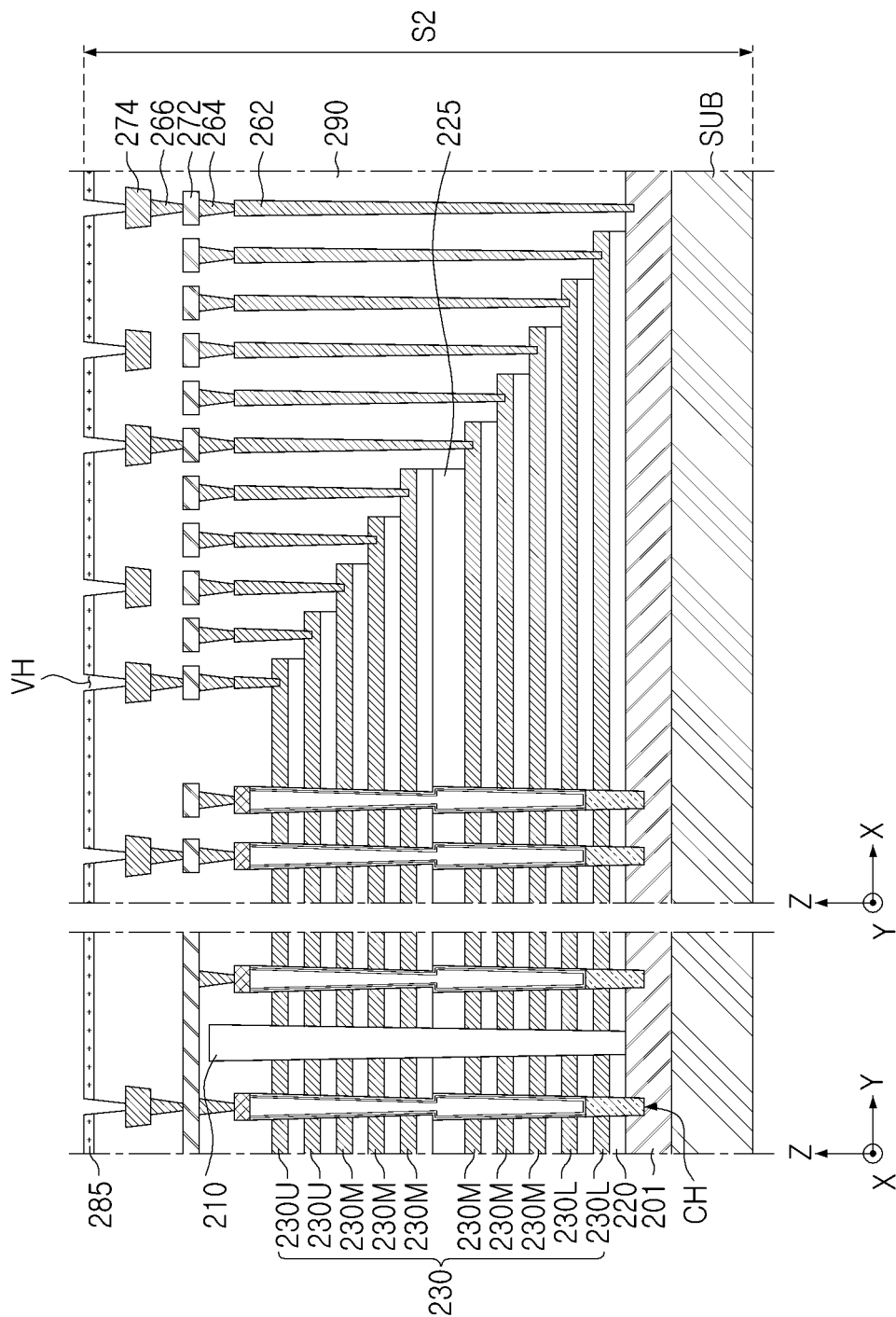

Referring to FIG. 12I, the second preliminary bonding insulating layer 285P and an upper region of the cell region insulating layer 290 may be patterned to form via holes VH.

The via holes VH may be formed using a separate mask layer. The via holes VH may be formed in regions corresponding to bonding vias 280 (refer to FIG. 1). The via holes VH may be formed to expose upper surfaces of the second cell interconnection lines 274. The via holes VH may be arranged to be spaced apart from each other, to have a circular or rectangular island shape in a plan view. As a result, a second bonding insulating layer 285, which is patterned, may be formed.

Figure 12J:
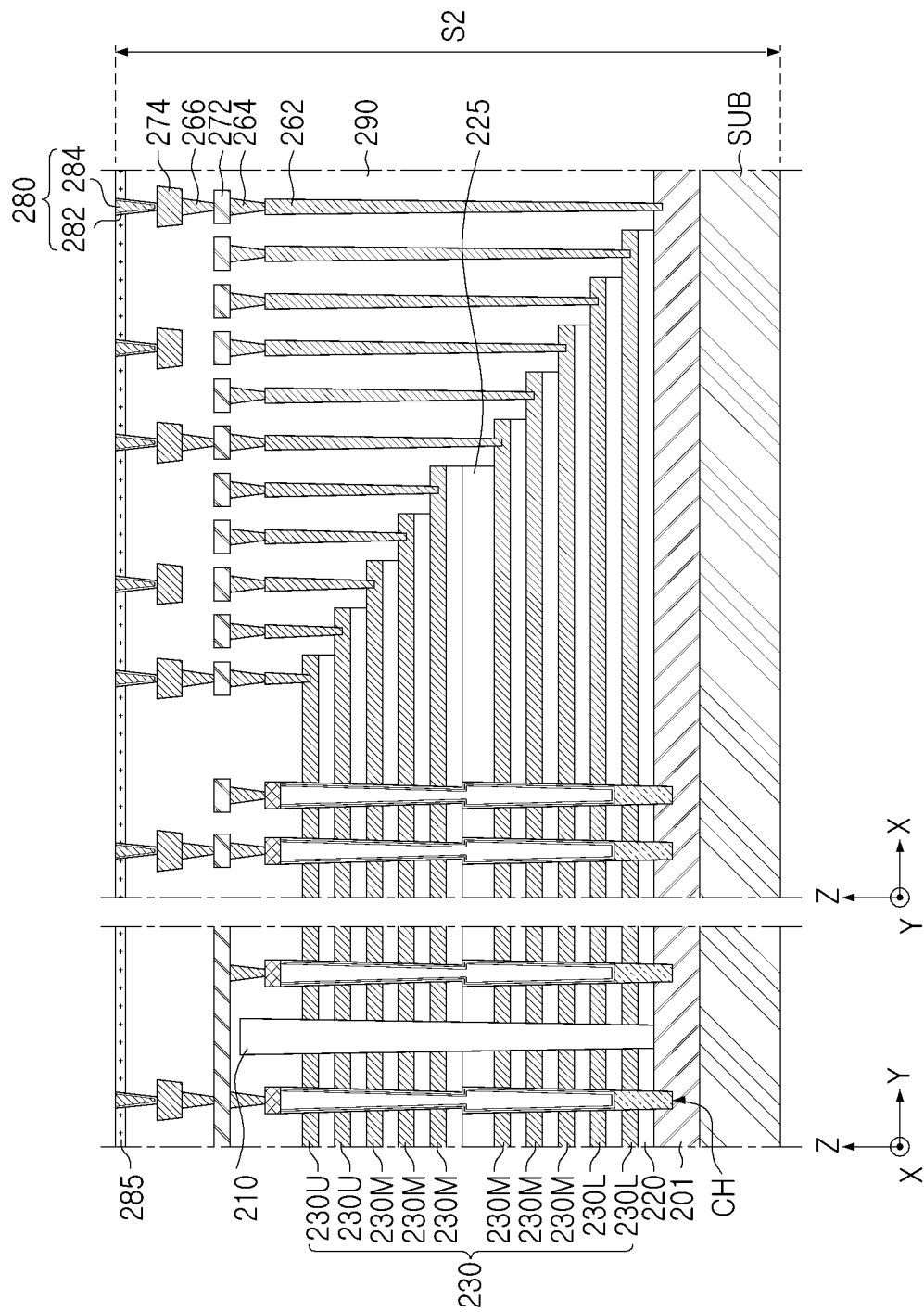

Referring to FIG. 12J, bonding vias 280 may be formed in the via holes VH.

The bonding vias 280 may be formed on the lower second cell interconnection lines 274 exposed through the second bonding insulating layer 285. The bonding vias 280 may be formed by a deposition process or a plating process. The bonding vias 280 may be formed by sequentially forming a barrier layer 282 and a via conductive layer 284. When the bonding vias 280 are formed by a plating process, the barrier layer 282 may correspond to a seed layer, or a separate seed layer may be first formed below the barrier layer 282. The second bonding insulating layer 285 may also function as a diffusion barrier layer for the bonding vias 280.

After the bonding vias 280 are formed, a heat treatment process and a CMP process may be further performed. During the CMP process, the bonding vias 280 may be formed such that upper surfaces thereof may be coplanar with an upper surface of the second bonding insulating layer 285 or may be formed to partially protrude from the second bonding insulating layer 285. Since a total area of the bonding vias 280 on a plan view is reduced, in a case of using the bonding vias 280 as a bonding structure as in this example embodiment, compared to a case of forming separate bonding pads, the CMP process may be easily performed. When the bonding vias 280 are formed to have a higher upper surface than the second bonding insulating layer 285, the semiconductor device 100a of the embodiment of FIG. 5 may be manufactured. The upper surfaces of the bonding vias 280 may be exposed through the second bonding insulating layer 285, and may form a portion of an upper surface of the second substrate structure S2. By this operation, the second substrate structure S2 may be prepared.

Figure 12K:
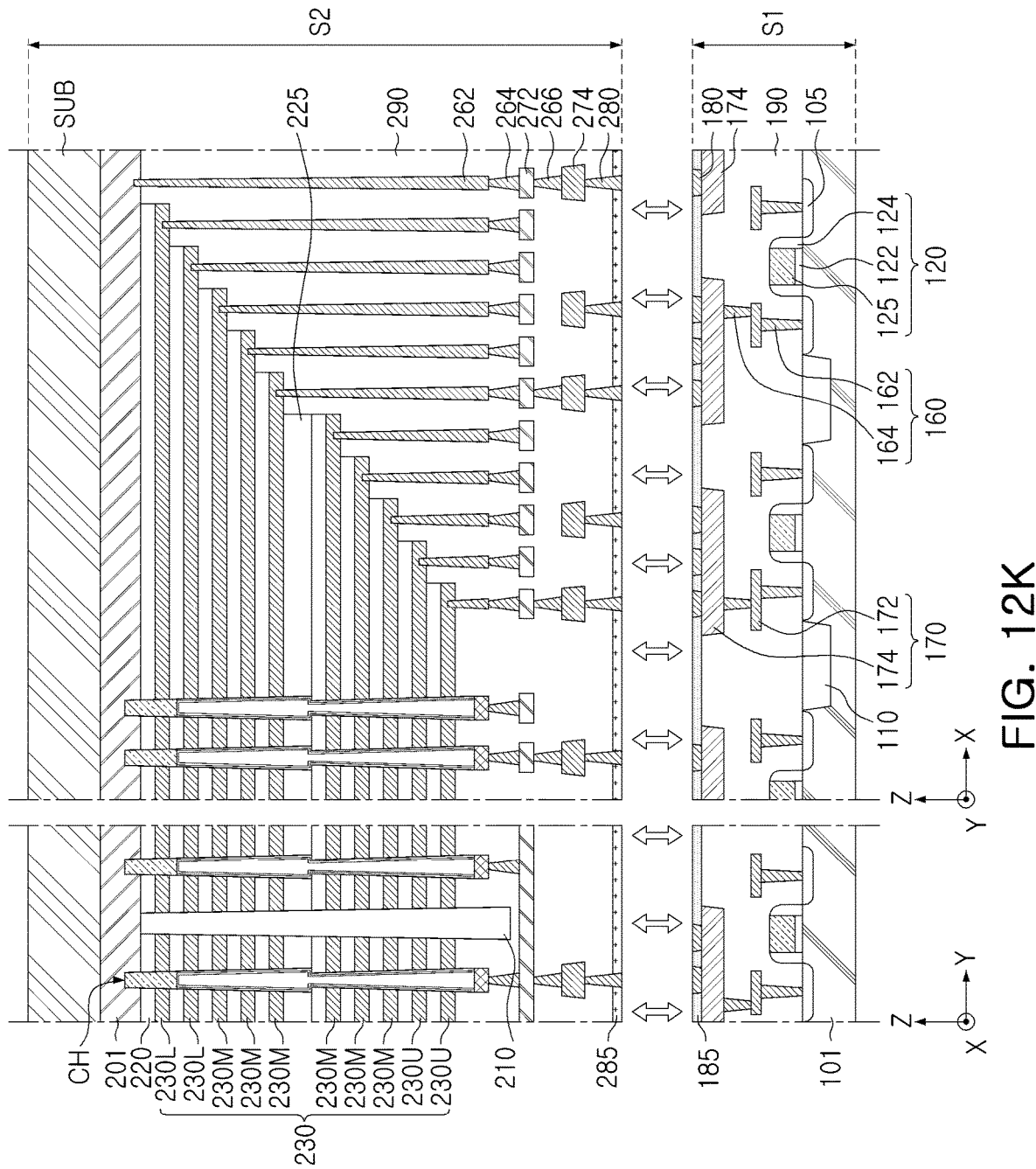

Referring to FIG. 12K, the second substrate structure S2 may be bonded to the first substrate structure S1.

The first substrate structure S1 and the second substrate structure S2 may be connected by pressing and bonding the bonding metal layers 180 and the bonding vias 280, the first bonding insulating layer 185 and the second bonding insulating layer 285, and the bonding metal layers 180 and the second bonding insulating layer 285, respectively. The second substrate structure S2 on the first substrate structure S1 may be turned over, and the bonding vias 280 may be bonded in a downward direction. In the drawings, for better understanding, it is illustrated that the second substrate structure S2 is bonded in a form of a mirror image with respect to the X-direction of the structure illustrated in FIG. 12J. The first substrate structure S1 and the second substrate structure S2 may be directly bonded without interposing an adhesive such as a separate adhesive layer. According to example embodiments, the bonding metal layers 180 and the bonding vias 280 may be partially expanded and bonded by heat and pressure during bonding. According to example embodiments, before bonding, in order to enhance bonding force, a surface treatment process such as hydrogen plasma treatment may be further performed on an upper surface of the first substrate structure S1 and a lower surface of the second substrate structure S2.

Figure 12L:
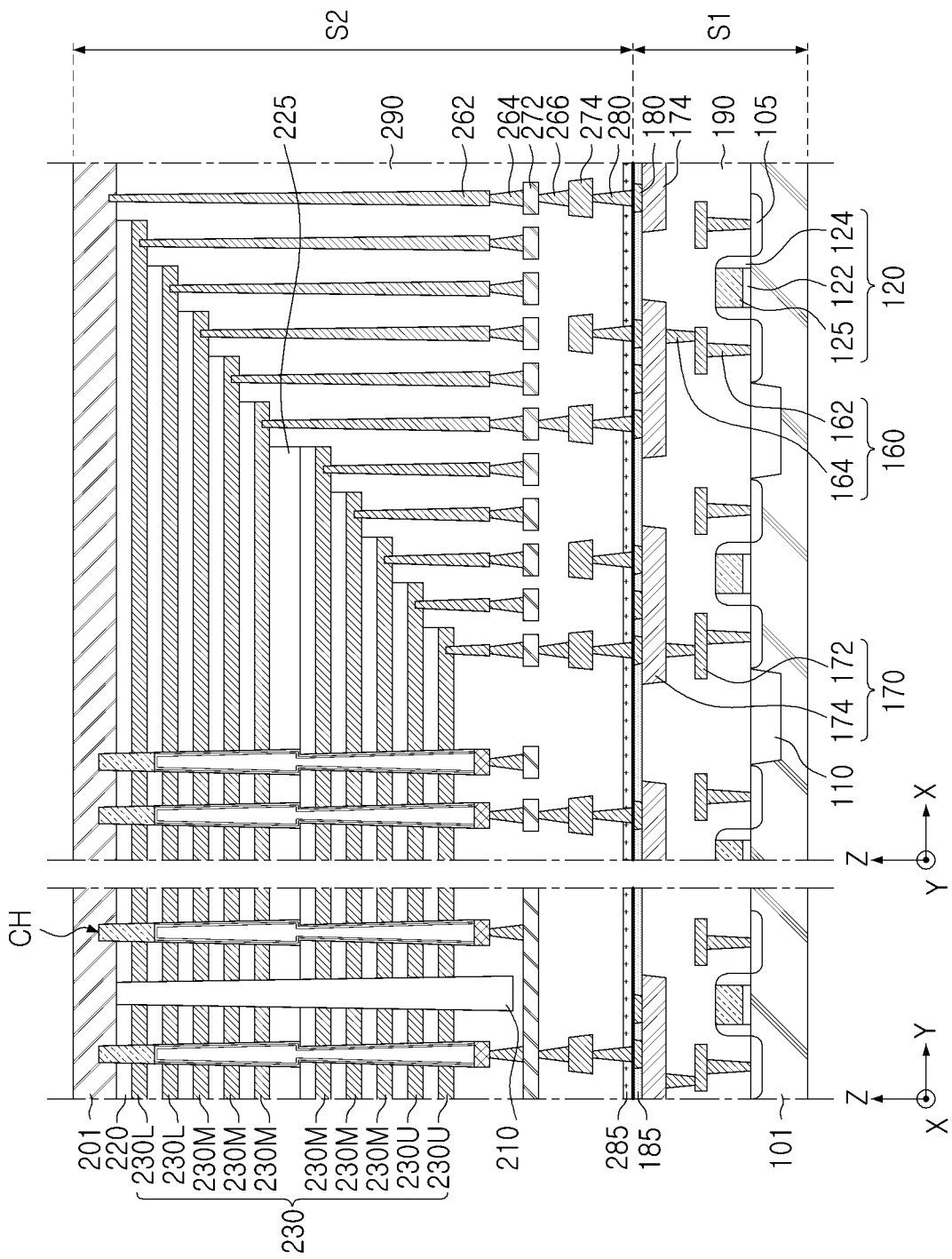

Referring to FIG. 12L, the base substrate SUB of the second substrate structure S2 may be removed from the bonding structure of the first and second substrate structures S1 and S2.

From the upper surface of the second substrate structure S2, a portion of the base substrate SUB may be removed by a polishing process such as a grinding process, and a remaining portion of the base substrate SUB may be removed by an etching process such as a wet etching process. By removing the base substrate SUB of the second substrate structure S2, a total thickness of a semiconductor device may be minimized.

Next, referring to FIG. 1 together, a passivation layer 295 may be formed on the second substrate 201, to finally manufacture the semiconductor device 100 of FIG. 1.

Figure 13:
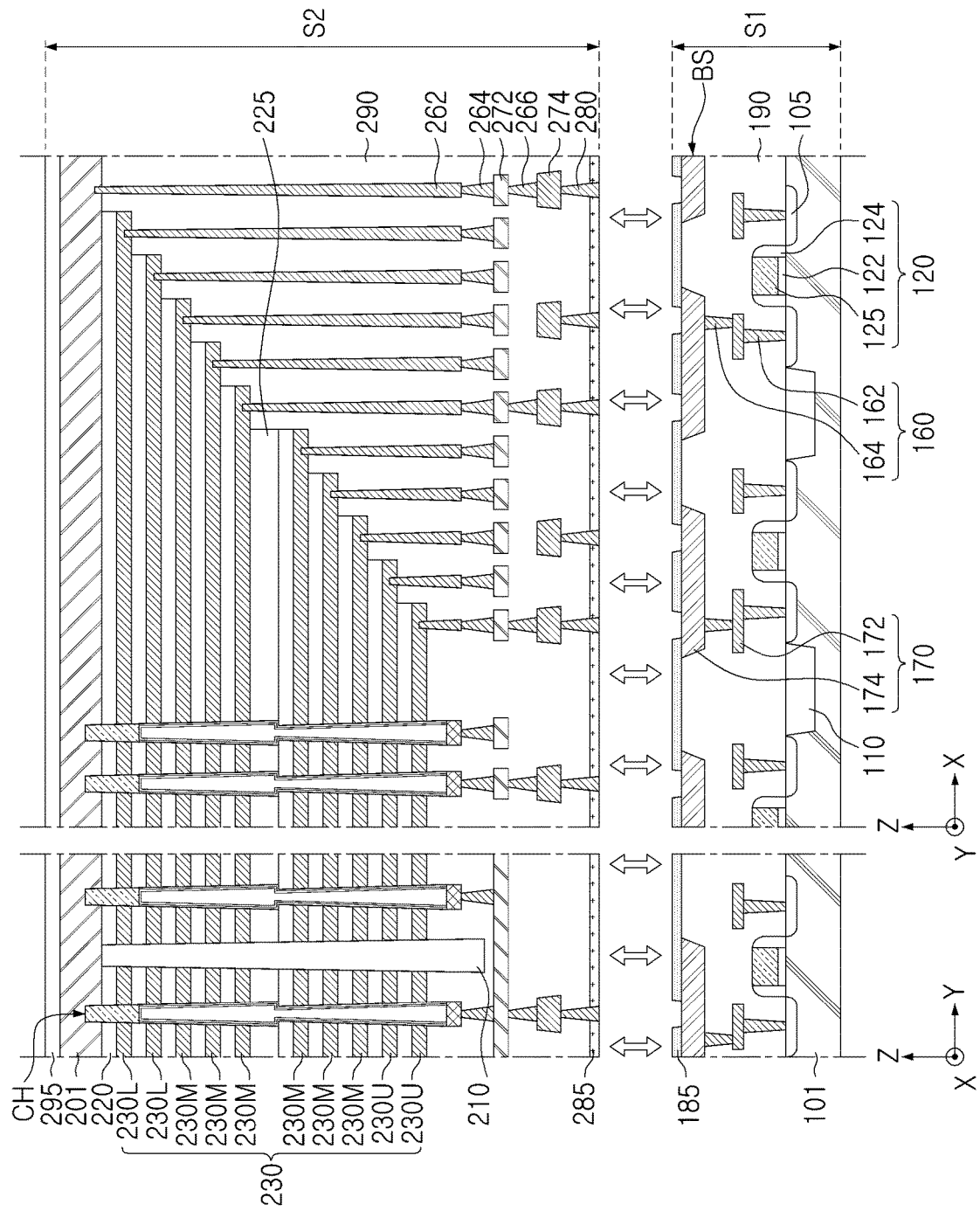
FIG. 13 is a cross-sectional view schematically illustrating a method of manufacturing a semiconductor device according to example embodiments.

FIG. 13 is a cross-sectional view schematically illustrating a method of manufacturing a semiconductor device according to example embodiments. FIG. 13 illustrates a region corresponding to FIG. 7.

Referring to FIG. 13, first, a first substrate structure S1 may be prepared by the process described above with reference to FIGS. 12A and 12B. In the first substrate structure S1, a first bonding insulating layer 185 may be in a patterned state. A second substrate structure S2 may be prepared by the process described above with reference to FIGS. 12D to 12J.

Next, the second substrate structure S2 may be bonded to the first substrate structure S1. The first substrate structure S1 and the second substrate structure S2 may be connected by pressing and bonding second circuit interconnection lines 174 and bonding vias 280, and a first bonding insulating layer 185 and a second bonding insulating layer 285, respectively. The first substrate structure S1 and the second substrate structure S2 may be directly bonded without interposing an adhesive such as a separate adhesive layer.

Due to heat and pressure during bonding, the bonding vias 280 and the second circuit interconnection lines 174 exposed through the first bonding insulating layer 185 may be partially expanded, to form a bonding structure as in the example embodiment of FIG. 8. When the bonding vias 280 are formed to protrude, the structure of the example embodiment of FIG. 10A may be formed. In addition, when the bonding vias 280 are expanded to protrude and an area of the second circuit interconnection lines 174 exposed through the first bonding insulating layer 185 is relatively large, the structure of the example embodiment of FIG. 10B may be formed.

Figure 14:
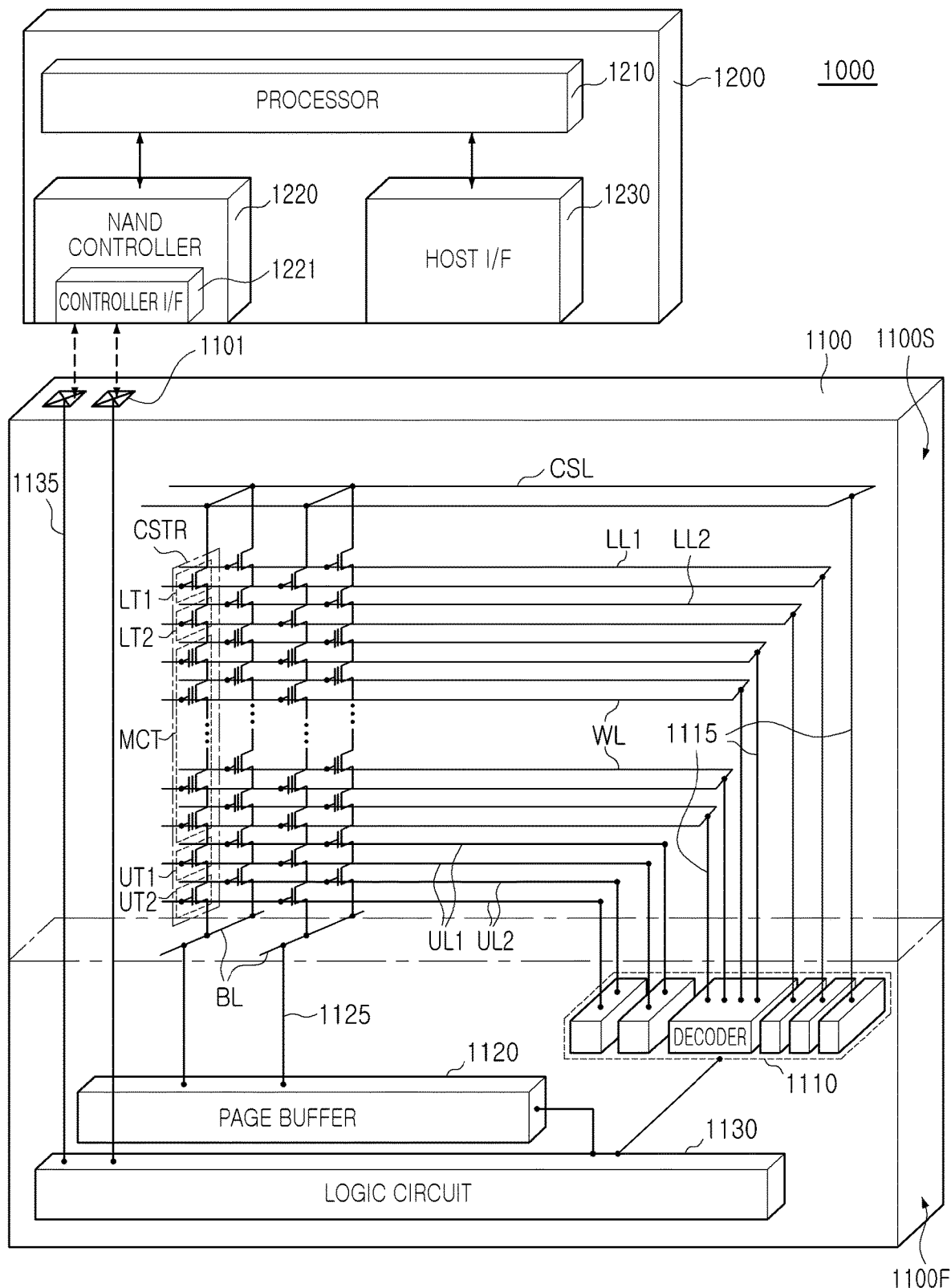
FIG. 14 is a view schematically illustrating a data storage system including a semiconductor device according to example embodiments.

FIG. 14 is a view schematically illustrating a data storage system including a semiconductor device according to example embodiments.

Referring to FIG. 14, a data storage system 1000 according to example embodiments of the present inventive concept may include a semiconductor device 1100 and a controller 1200 electrically connected to the semiconductor device 1100. The data storage system 1000 may be a storage device including one or more semiconductor devices 1100, or an electronic device including the storage device. For example, the data storage system 1000 may be a solid state drive device (SSD), a universal serial bus (USB), a computing system, a medical device, or a communication device, including one or more semiconductor devices 1100.

The semiconductor device 1100 may be a non-volatile memory device, for example, a NAND flash memory device described above with reference to FIGS. 1 to 11. The semiconductor device 1100 may include a first structure 1100F, and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second upper gate lines UL1 and UL2, first and second lower gate lines LL1 and LL2, and memory cell strings CSTR between the bit lines BL and the common source line CSL.

In the second structure 1100S, each of the memory cell strings CSTR may include lower transistors LT1 and LT2 adjacent to the common source line CSL, upper transistors UT1 and UT2 adjacent to each of the bit lines BL, and a plurality of memory cell transistors MCT disposed between each of the lower transistors LT1 and LT2 and each of the upper transistors UT1 and UT2. The number of lower transistors LT1 and LT2 and the number of upper transistors UT1 and UT2 may be changed according to example embodiments.

In example embodiments, each of the upper transistors UT1 and UT2 may include a string select transistor, and each of the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 and the upper erase control transistor UT2 may be used for an erase operation of erasing data stored in the memory cell transistors MCT using a GIDL phenomenon.

The common source line CSL, the first and second lower gate lines LL1 and LL2, the word lines WL, and the first and second upper gate lines UL1 and UL2 may be electrically connected to the decoder circuit 1110 through first connection interconnections 1115 extending from the first structure 1100F into the second structure 1100S. The bit lines BL may be electrically connected to the page buffer 1120 through second connection interconnections 1125 extending from the first structure 1100F into the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection interconnections 1135 extending from the first structure 1100F into the second structure 1100S.

The controller 1200 may include a processor 1210, a NAND controller 1220, and a host interface 1230. According to example embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware, and may access to the semiconductor device 1100 by controlling the NAND controller 1220. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221. The host interface 1230 may provide a communication function between the data storage system 1000 and an external host. When a control command is received from the external host through the host interface 1230, the processor 1210 may control the semiconductor device 1100 in response to the control command.

Figure 15:
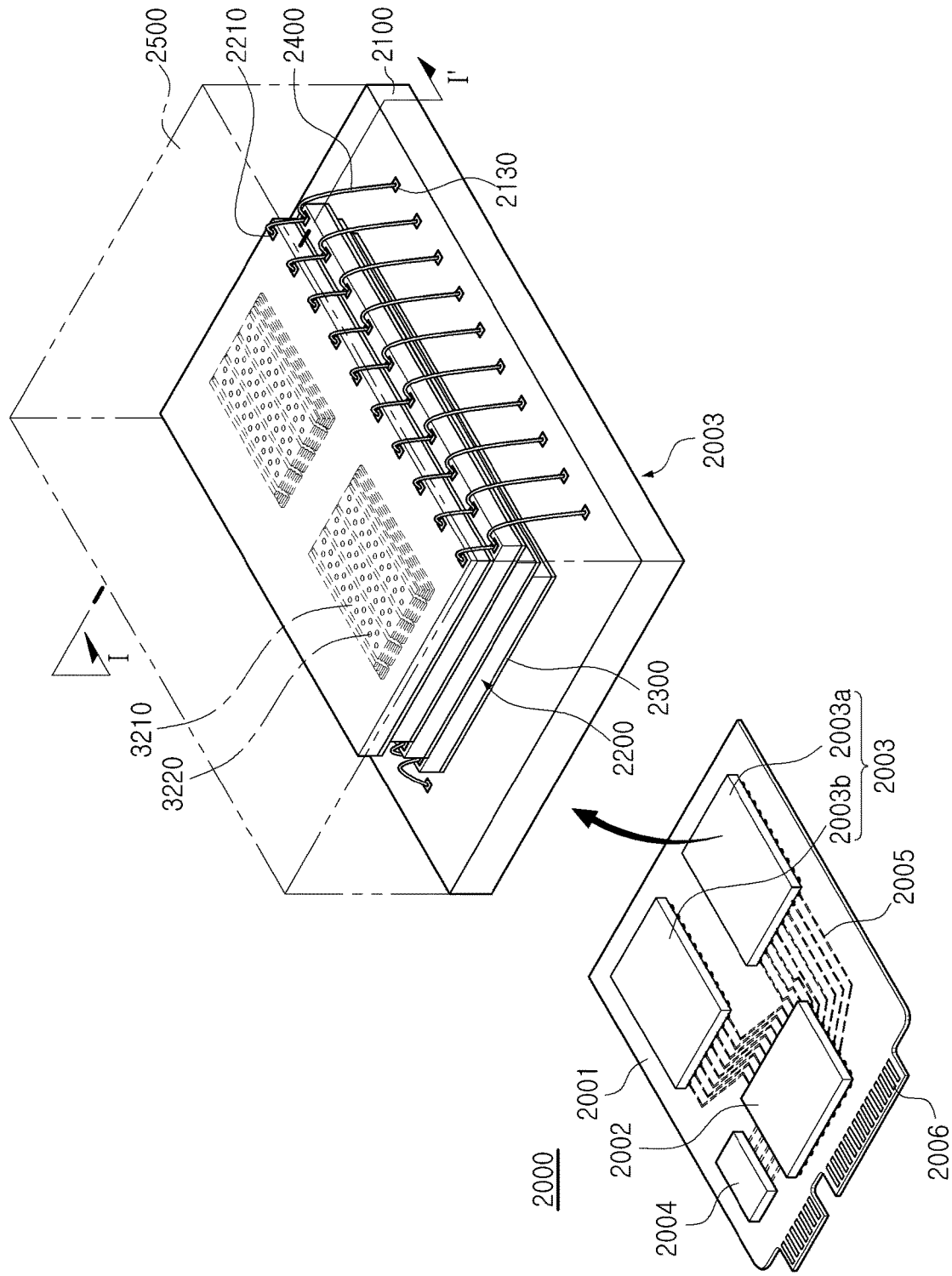
FIG. 15 is a perspective view schematically illustrating a data storage system including a semiconductor device according to an example embodiment.

FIG. 15 is a perspective view schematically illustrating a data storage system including a semiconductor device according to example embodiments.

Referring to FIG. 15, a data storage system 2000 according to example embodiments of the present inventive concept may include a main substrate 2001, a controller 2002 mounted on the main substrate 2001, a semiconductor package 2003, which may be provided as one or more semiconductor packages, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In example embodiments, the data storage system 2000 may be in communication with the external host according to any one interface of a universal serial bus (USB), peripheral component interconnection express (PCIe), serial advanced technology attachment (SATA), M-Phy for universal flash storage (UFS), or the like. In example embodiments, the data storage system 2000 may be operated by power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may improve an operation speed of the data storage system 2000.

The controller 2002 may write data to the semiconductor package 2003 or read data from the semiconductor package 2003, and may improve the operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages 2003a and 2003b, spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 14. Each of the semiconductor chips 2200 may include gate stack structures 3210 and memory channel structures 3220. Each of the semiconductor chips 2200 may include the semiconductor device described above with reference to FIGS. 1 to 11.

In example embodiments, the connection structure 2400 may be a bonding wire electrically connecting the input/output pad 2210 and the package upper pads 2130. Therefore, in each of the first and second semiconductor packages 2003a and 2003b, the semiconductor chips 2200 may be electrically connected to each other by a bonding wire process, and may be electrically connected to the package upper pads 2130 of the package substrate 2100. According to example embodiments, in each of the first and second semiconductor packages 2003a and 2003b, the semiconductor chips 2200 may be electrically connected to each other by a connection structure including a through silicon via (TSV), instead of a connection structure 2400 by a bonding wire process.

In example embodiments, the controller 2002 and the semiconductor chips 2200 may be included in one (1) package. In example embodiments, the controller 2002 and the semiconductor chips 2200 may be mounted on a separate interposer substrate, different from the main substrate 2001, and the controller 2002 and the semiconductor chips 2200 may be connected to each other by an interconnection formed on the interposer substrate.

Figure 16:
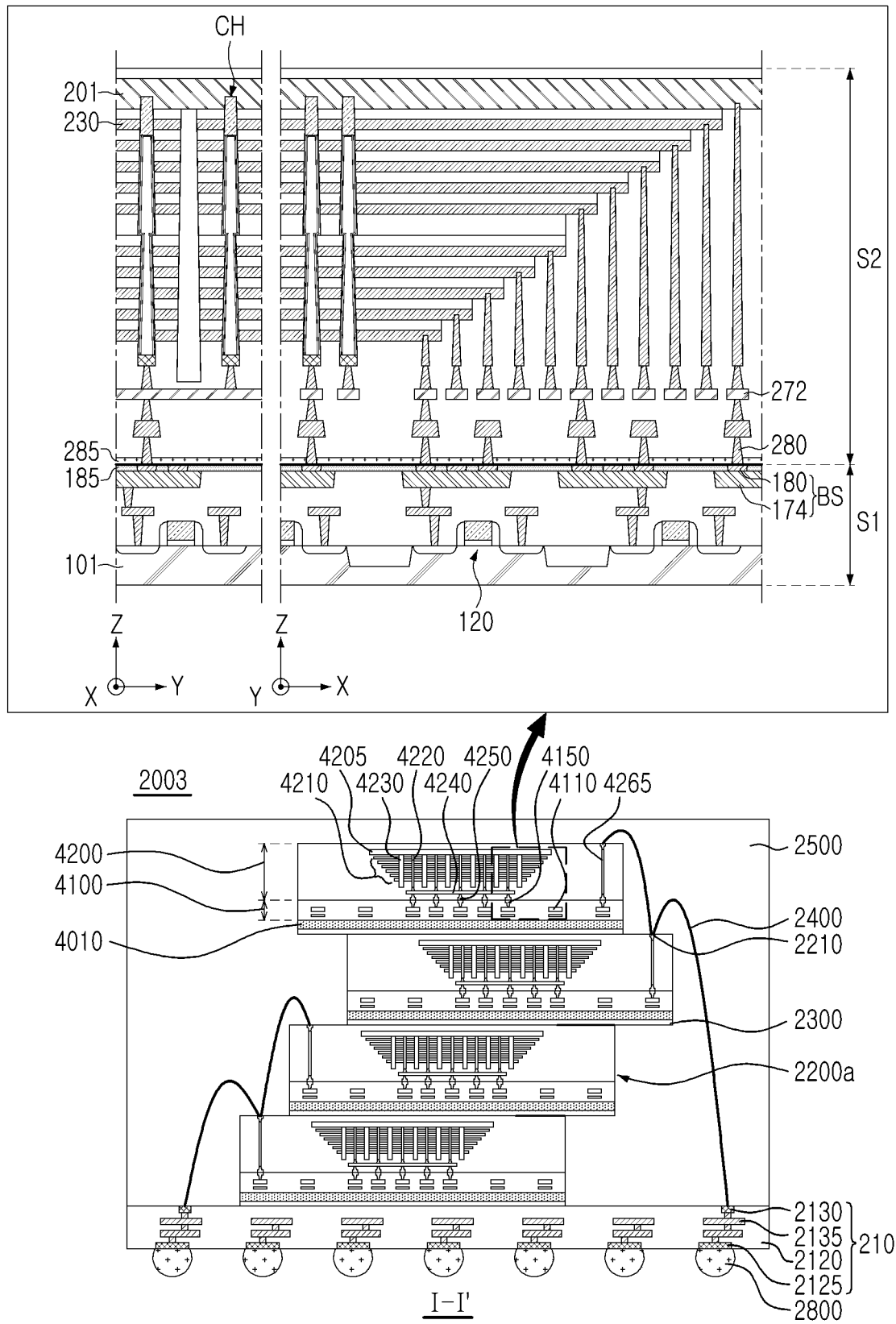
FIG. 16 is a cross-sectional view schematically illustrating a semiconductor package according to example embodiments.

FIG. 16 is a cross-sectional view schematically illustrating a semiconductor package according to example embodiments. FIG. 16 illustrates example embodiments of the semiconductor package 2003 of FIG. 15, and conceptually illustrates a region taken along line I-I' of the semiconductor package 2003 of FIG. 15.

Referring to FIG. 16, in a semiconductor package 2003, semiconductor chips 2200a may include a semiconductor substrate 4010, a first structure 4100 disposed on the semiconductor substrate 4010, and a second structure 4200 disposed on and bonded to the first structure 4100 by a wafer bonding method, respectively.

The first structure 4100 may include a peripheral circuit region including a peripheral interconnection 4110 and first bonding structures 4150. The second structure 4200 may include a common source line 4205, a gate stack structure 4210 between the common source line 4205 and the first structure 4100, memory channel structures 4220 and a separation region 4230, passing through the gate stack structure 4210, and second bonding structures 4250 electrically connected to word lines (WL of FIG. 14) of the memory channel structures 4220 and the gate stack structure 4210, respectively. For example, the second bonding structures 4250 may be electrically connected to the memory channel structures 4220 and word lines (WL of FIG. 14), through bit lines 4240 electrically connected to the memory channel structures 4220 and first cell contact plugs 262 (see FIG. 1) electrically connected to word lines (WL of FIG. 14). The first bonding structures 4150 of the first structure 4100 and the second bonding structures 4250 of the second structure 4200 may be bonded while contacting each other. Portions in which the first bonding structures 4150 and the second bonding structures 4250 are bonded may be formed of, for example, copper (Cu).

As illustrated in the enlarged view, the first structure 4100 and the second structure 4200 may be bonded by bonding of a bonding structure BS and bonding vias 280, and bonding of a first bonding insulating layer 185 and a second bonding insulating layer 285. Each of the semiconductor chips 2200a may further include an input/output pad 2210 and an input/output connection interconnection 4265 below the input/output pad 2210. The input/output connection interconnection 4265 may be electrically connected to portions of the second bonding structures 4250.

The semiconductor chips 2200a may be electrically connected to each other by connection structures 2400 in a form of bonding wires. In example embodiments, semiconductor chips in one (1) semiconductor package, such as the semiconductor chips 2200a, may be electrically connected to each other by a connection structure including a through electrode TSV.

A configuration of a bonding structure in a structure in which two or more substrate structures are bonded may be optimized, to provide a semiconductor device having improved degree of integration and mass productivity, and a data storage system including the same.

Various advantages and effects of the present inventive concept are not limited to the above description, and can be more easily understood in the process of describing specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a first substrate structure comprising a first substrate, circuit devices on the first substrate, first interconnection lines on the circuit devices, bonding metal layers on the first interconnection lines, and a first bonding insulating layer on the first interconnection lines and on lateral surfaces of the bonding metal layers; and
a second substrate structure on the first substrate structure and in contact with the first substrate structure, the second substrate structure comprising a second substrate spaced apart from the first substrate structure, gate electrodes stacked between the second substrate and the first substrate structure, spaced apart from each other in a first direction, that is perpendicular to a lower surface of the second substrate, and electrically connected to the circuit devices, channel structures that penetrate the gate electrodes and extend in the first direction and comprising respective channel layers, second interconnection lines on the channel structures spaced apart from the second substrate, bonding vias between the second interconnection lines and the bonding metal layers, and having a lateral surface that is inclined such that widths of the bonding vias increase approaching the first substrate structure, and a second bonding insulating layer in contact with at least lower portions of the bonding vias,
wherein the first substrate structure comprises a first bonding surface comprising upper surfaces of the bonding metal layers and an upper surface of the first bonding insulating layer,
wherein the second substrate structure comprises a second bonding surface that contacts the first bonding surface, and comprising lower surfaces of the bonding vias and a lower surface of the second bonding insulating layer, wherein the bonding metal layers comprise dummy bonding metal layers not connected to the bonding vias and in contact with the second bonding insulating layer, and wherein a portion of the lower surface of the second bonding insulating layer extends below an upper surface of the first bonding insulating layer.

2. The semiconductor device of claim 1,
wherein the bonding metal layers on the first bonding surface have a first width, and wherein the bonding vias at the second bonding surface have a second width that is less than the first width.

3. The semiconductor device of claim 2, wherein the second width is in a range of about 100 nm to about 300 nm.

4. The semiconductor device of claim 2,
wherein the bonding vias are spaced apart from each other by a first distance in a second direction that is parallel to the lower surface of the second substrate, and
wherein the first distance is 5 times or more the second width.

5. The semiconductor device of claim 1,
wherein the bonding metal layers have a first height, and wherein the bonding vias have a second height that is greater than the first height.

6. The semiconductor device of claim 5, wherein the second height is in a range of about 3 times to about 10 times the first height.

7. The semiconductor device of claim 1, wherein respective thicknesses of portions of the bonding metal layers that are adjacent the bonding vias are less than a thickness of the first bonding insulating layer.

8. The semiconductor device of claim 1,
wherein the second substrate structure further comprises bit lines between the channel structures and the second interconnection lines, and
wherein the bit lines are electrically connected to the channel structures and the second interconnection lines.

9. The semiconductor device of claim 1,
wherein each of the channel structures comprises lower and upper channel structures with a bent portion therebetween, and
wherein the bent portion is adjacent an interface where a width of a corresponding one of the lower channel structures is different from a width of a corresponding one of the upper channel structures.

10. The semiconductor device of claim 1, wherein an upper surface of the second bonding insulating layer comprises a curvature shape.

11. The semiconductor device of claim 1, wherein a maximum width to height ratio of the bonding metal layers is 10.

12. The semiconductor device of claim 1, wherein the bonding vias have a higher aspect ratio than the bonding metal layers.

13. A semiconductor device comprising:
a first substrate structure comprising a first substrate, circuit devices on the first substrate, first interconnection lines on the circuit devices, bonding metal layers on the first interconnection lines, and a first bonding insulating layer on the first interconnection lines; and
a second substrate structure on the first substrate structure and in contact with the first substrate structure, the second substrate structure comprising a second substrate spaced apart from the first substrate structure, gate electrodes stacked between the second substrate and the first substrate structure, spaced apart from each other in a first direction, that is perpendicular to a lower surface of the second substrate, and electrically connected to the circuit devices, channel structures that penetrate the gate electrodes and extend in the first direction and comprising respective channel layers, second interconnection lines on the channel structures spaced apart from the second substrate, bonding vias between the second interconnection lines and the bonding metal layers, and each being tapered away from the first substrate, and a second bonding insulating layer in contact with at least lower portions of the bonding vias,
wherein the first substrate structure comprises a first bonding surface comprising upper surfaces of the bonding metal layers and an upper surface of the first bonding insulating layer,
wherein the second substrate structure comprises a second bonding surface in contact with the first bonding surface, and comprising lower surfaces of the bonding vias and a lower surface of the second bonding insulating layer,
wherein a total area of the upper surfaces of the bonding metal layers of the first bonding surface is larger than a total area of the lower surfaces of the bonding vias of the second bonding surface, and
wherein a portion of the lower surface of the second bonding insulating layer extends below the upper surface of the first bonding insulating layer.

14. The semiconductor device of claim 13,
wherein each of the bonding vias comprises a barrier metal layer extending along sidewalls from the second interconnection lines, and
wherein each of the bonding vias electrically connects one of the first interconnection lines and a corresponding one of the second interconnection lines.

15. The semiconductor device of claim 14, wherein the bonding metal layers are protrusions of the first interconnection lines that protrude from upper surfaces of the first interconnection lines in regions contacting the bonding vias.

16. The semiconductor device of claim 13, wherein the total area of the lower surfaces of the bonding vias of the second bonding surface is smaller than a total area of the lower surface of the second bonding insulating layer of the second bonding surface.

17. The semiconductor device of claim 13, wherein the first bonding insulating layer and the second bonding insulating layer are between upper surfaces of the first interconnection lines and lower surfaces of the second interconnection lines.

18. The semiconductor device of claim 13, wherein an interface between the first bonding insulating layer and the second bonding insulating layer is higher than the lower surfaces of the bonding vias relative to the first substrate.

* * * * *